(12) United States Patent
Moriwaki et al.

(10) Patent No.: US 10,727,429 B2
(45) Date of Patent: Jul. 28, 2020

(54) INSULATING MATERIAL, ELECTRONIC DEVICE AND IMAGING APPARATUS

(71) Applicant: SONY CORPORATION, Tokyo (JP)

(72) Inventors: Toshiki Moriwaki, Kanagawa (JP); Mari Ichimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/750,894

(22) PCT Filed: Jun. 20, 2016

(86) PCT No.: PCT/JP2016/068265
§ 371 (c)(1),
(2) Date: Feb. 7, 2018

(87) PCT Pub. No.: WO2017/029877
PCT Pub. Date: Feb. 23, 2017

(65) Prior Publication Data
US 2018/0226596 A1 Aug. 9, 2018

(30) Foreign Application Priority Data

Aug. 19, 2015 (JP) .................................. 2015-161779

(51) Int. Cl.
*H01L 51/44* (2006.01)
*H01L 27/30* (2006.01)
(Continued)

(52) U.S. Cl.
CPC .......... *H01L 51/448* (2013.01); *H01L 27/146* (2013.01); *H01L 27/307* (2013.01);
(Continued)

(58) Field of Classification Search
None
See application file for complete search history.

(56) References Cited

U.S. PATENT DOCUMENTS

2003/0047735 A1  3/2003  Kyoda
2004/0162212 A1* 8/2004  Koyama ............... C03C 3/078
                                                           501/70
(Continued)

FOREIGN PATENT DOCUMENTS

JP  2003-040647  2/2003
JP  2009-120472  6/2009
(Continued)

OTHER PUBLICATIONS

International Search Report prepared by the Japan Patent Office dated Aug. 22, 2016, for International Application No. PCT/JP2016/068265.

*Primary Examiner* — Walter H Swanson
*Assistant Examiner* — Kien C Ly
(74) *Attorney, Agent, or Firm* — Sheridan Ross P.C.

(57) ABSTRACT

An electronic device includes a first electrode 31, a light emitting/light receiving layer 20 formed on the first electrode 31, and a second electrode 32 formed on the light emitting/light receiving layer 20. The light emitting/light receiving layer 20 and/or the second electrode 32 is covered by an insulating layer 40 including a metal oxide that contains, as a main component, zinc oxide, while containing, as accessory components, at least two materials selected from the group consisting of aluminum oxide, magnesium oxide, niobium oxide, titanium oxide, molybdenum oxide and hafnium oxide.

11 Claims, 11 Drawing Sheets

(51) Int. Cl.
*H01L 27/146* (2006.01)
*H01L 51/52* (2006.01)
*H01L 33/44* (2010.01)
*H01L 31/0216* (2014.01)
*H01S 5/028* (2006.01)
*H01L 33/00* (2010.01)
*H01L 51/00* (2006.01)
*H01S 5/183* (2006.01)
*H01S 5/187* (2006.01)

(52) U.S. Cl.
CPC ........ *H01L 31/02161* (2013.01); *H01L 33/44* (2013.01); *H01L 51/441* (2013.01); *H01L 51/442* (2013.01); *H01L 51/5234* (2013.01); *H01L 51/5253* (2013.01); *H01L 33/0045* (2013.01); *H01L 51/0074* (2013.01); *H01L 51/0078* (2013.01); *H01L 51/0081* (2013.01); *H01L 2251/303* (2013.01); *H01L 2251/308* (2013.01); *H01S 5/028* (2013.01); *H01S 5/0282* (2013.01); *H01S 5/183* (2013.01); *H01S 5/187* (2013.01); *Y02E 10/549* (2013.01); *Y02P 70/521* (2015.11)

(56) References Cited

U.S. PATENT DOCUMENTS

| | | | |
|---|---|---|---|
| 2010/0159255 A1* | 6/2010 | Lee | C09D 183/04 428/447 |
| 2011/0300770 A1* | 12/2011 | Fukuda | B32B 15/08 445/58 |
| 2012/0318356 A1* | 12/2012 | Fechner | C03C 3/112 136/259 |
| 2014/0026619 A1* | 1/2014 | Maloney | C03B 23/245 65/43 |
| 2014/0231782 A1 | 8/2014 | Imai | |
| 2014/0306180 A1 | 10/2014 | Moriwaki | |
| 2015/0047707 A1* | 2/2015 | Kim | H01L 31/02168 136/259 |
| 2016/0260912 A1* | 9/2016 | Arai | H01L 51/0074 |
| 2016/0376187 A1* | 12/2016 | Gross | C03C 3/097 361/679.01 |
| 2016/0380222 A1* | 12/2016 | Satoh | H01L 51/448 257/40 |
| 2018/0277691 A1* | 9/2018 | Karkkainen | G02B 1/111 |

FOREIGN PATENT DOCUMENTS

| | | |
|---|---|---|
| JP | 2013-118363 | 6/2013 |
| JP | 2014-220488 | 11/2014 |

* cited by examiner

INSULATING MATERIAL, ELECTRONIC DEVICE AND IMAGING APPARATUS

CROSS REFERENCE TO RELATED APPLICATIONS

This application is a national stage application under 35 U.S.C. 371 and claims the benefit of PCT Application No. PCT/JP2016/068265 having an international filing date of 20 Jun. 2016, which designated the United States, which PCT application claimed the benefit of Japan Patent Application No. 2015-161779 filed 19 Aug. 2015, the disclosures of each of which are incorporated herein by reference.

TECHNICAL FIELD

The present disclosure relates to an insulating material, an electronic device including an insulating layer including the insulating material, and an imaging apparatus in which the electronic device is incorporated.

BACKGROUND ART

An electronic device including a photoelectric conversion element such as an image sensor is configured, for example, by stacking a first electrode, a light emitting/light receiving layer constituting a photoelectric conversion portion, and a second electrode. The second electrode is a transparent electrode, and electrons are trapped by the electrode on one side, whereas holes are trapped by the electrode on the other side, to read a photoelectric current. It is known that in the case where the light emitting/light receiving layer, for example, includes an organic material, the light emitting/light receiving layer is deteriorated by moisture, oxygen or the like. Therefore, the second electrode or the like is covered by an insulating layer functioning as a protective layer, to thereby restraining the light emitting/light receiving layer from being deteriorated (see, for example, JP 2013-118363A).

CITATION LIST

Patent Literature

[PTL 1]
  JP 2013-118363A

SUMMARY

Technical Problem

Meanwhile, in the technology disclosed in the above-mentioned patent literature, the insulating layer includes a single layer of a silicon oxynitride layer or includes a two-layer structure of a silicon oxynitride layer (upper layer)/aluminum oxide layer (lower layer) or the like, which is formed based on a vapor phase growth method. In addition, the second electrode (counter electrode) includes a metal, a metal oxide, a metal nitride, a metal boride, an organic conductive compound, a mixture thereof or the like. Besides, it is necessary that formation of the second electrode and formation of the insulating layer should be conducted based on different processes. Therefore, the formation of the second electrode and the formation of the insulating layer cannot be carried out based on a series of process, so that the electronic device cannot be produced by a more rational method. In addition, the insulating layer is formed, for example, based on an atomic layer deposition method such as a plasma CVD method and an ALCVD method, and the film formation temperature in this instance is 150° C. to 250° C., or 100° C. to 200° C.

Accordingly, it is an object of the present disclosure to provide an electronic device capable of being produced by a more rational method or through a process at a lower temperature, an imaging apparatus in which the electronic device is incorporated, and an insulating material.

Solution to Problem

An electronic device of the present disclosure for achieving the above object includes a first electrode, a light emitting/light receiving layer formed on the first electrode, and a second electrode formed on the light emitting/light receiving layer, in which the light emitting/light receiving layer and/or the second electrode is covered by an insulating layer including a metal oxide that contains, as a main component, zinc oxide, while containing, as accessory components, at least two materials selected from the group consisting of aluminum oxide, magnesium oxide, niobium oxide, titanium oxide, molybdenum oxide and hafnium oxide.

An imaging apparatus of the present disclosure for achieving the above object includes the above-mentioned electronic device of the present disclosure.

An insulating material of the present disclosure for achieving the above object includes a metal oxide that contains, as a main component, zinc oxide, while containing, as accessory components, at least two materials selected from the group consisting of aluminum oxide, magnesium oxide, niobium oxide, titanium oxide, molybdenum oxide and hafnium oxide.

Advantageous Effects of Invention

In the electronic device of the present disclosure and the electronic device constituting the imaging apparatus of the present disclosure (these may hereinafter be generically referred to as "the electronic device, etc. of the present disclosure") and in the insulating material of the present disclosure, a material that contains, as a main component, zinc oxide, while containing, as accessory components, aluminum oxide, magnesium oxide and the like is prescribed, and, accordingly, the electronic device can be produced by a more rational method and through a process at a lower temperature. Note that the effects described herein are merely exemplary and not restrictive, and additional effects may exist.

DESCRIPTION OF EMBODIMENTS

Figure 1A:
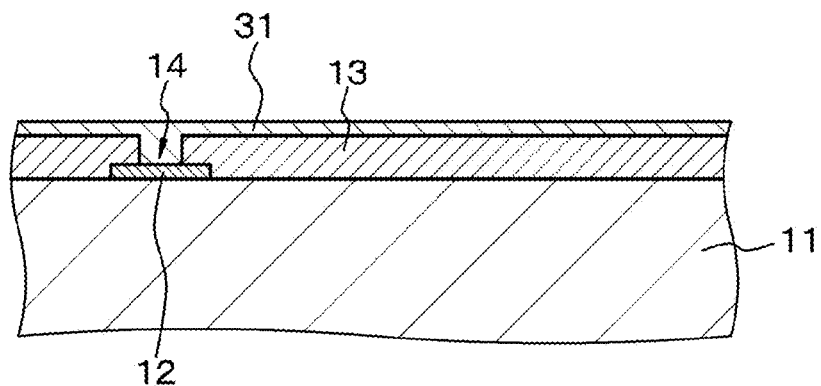
FIGS. 1A and 1B are a schematic partial sectional view of an electronic device of Example 1 in the course of its production and a schematic partial sectional view of the electronic device of Example 1.

The present disclosure will be described based on Examples below, referring to the drawings, but the present disclosure is not to be restricted by the Examples, and various numerical values and materials in the Examples are mere exemplary. Note that the description will be made in the following order.

1. Description in general of insulating material, electronic device and imaging apparatus of the present disclosure
2. Example 1 (Insulating material and electronic device of the present disclosure)
3. Example 2 (Modification of Example 1)
4. Example 3 (Another modification of Example 1)
5. Example 4 (Further modification of Example 1)
6. Example 5 (Imaging apparatus of the present disclosure)
7. Others <Description in General of Insulating Material, Electronic Device and Imaging Apparatus of the Present Disclosure>

In the electronic device, etc. of the present disclosure or the insulating material of the present disclosure, the content of accessory components is preferably 5 to 30 at %, on a metallic atom basis. In addition, in the electronic device, etc. of the present disclosure or the insulating material of the present disclosure including such a preferable mode, the accessory components preferably include aluminum oxide and magnesium oxide.

In the electronic device, etc. of the present disclosure that include the above-described various preferable modes, it is desirable that the thickness of an insulating layer on a second electrode is $5 \times 10^{-8}$ to $7 \times 10^{-7}$ m, preferably $1.5 \times 10^{-7}$ to $7 \times 10^{-7}$ m, and more preferably $3 \times 10^{-7}$ to $7 \times 10^{-7}$ m.

Further, in the electronic device, etc. of the present disclosure that include the above-described various preferable modes, the absolute value of internal stress in the insulating layer is preferably not more than 50 MPa, in other words, compressive stress or tensile stress is preferably not more than 50 MPa. Alternatively, compressive stress in the insulating layer is preferably not more than 50 MPa. With the absolute value of the internal stress in the insulating layer thus suppressed to be low, film stress in the insulating layer can be suppressed, and bad influences on a light emitting/light receiving layer, for example, such bad influences as lowering in characteristics, lowering in durability, and lowering in yield due to film stress can be suppressed.

Furthermore, in the electronic device, etc. of the present disclosure that include the above-described various preferable modes, the insulating layer is preferably transparent and amorphous.

Furthermore, in the electronic device, etc. of the present disclosure that include the above-described various preferable modes, the light transmittance of the insulating layer to light of a wavelength of 400 to 660 nm is preferably not less than 80%.

Furthermore, in the electronic device, etc. of the present disclosure that include the above-described various preferable modes, the light transmittance of the second electrode to light of a wavelength of 400 to 660 nm is preferably not less than 75%. In addition, the light transmittance of the first electrode to light of a wavelength of 400 to 660 nm is preferably not less than 75%.

Furthermore, in the electronic device, etc. of the present disclosure that include the above-described various preferable modes, the light emitting/light receiving layer preferably includes an organic photoelectric conversion material, and, in this case, the electronic device may be in a mode of including a photoelectric conversion element.

In the electronic device, etc. of the present disclosure, the sheet resistance of the insulating layer is desirably not less than $1 \times 10^5 \Omega/\square$. In addition, the refractive index of the insulating layer is desirably 1.9 to 2.2, whereby broadening of the spectrum width of light that can be transmitted effectively through the insulating layer (referred to as "transmitted light spectrum width") can be realized.

In the electronic device, etc. of the present disclosure that include the above-described various preferable modes, a configuration can be adopted in which the difference between the value of work function of the second electrode and the value of work function of the first electrode (the value obtained by subtracting the value of work function of the first electrode from the value of work function of the second electrode) is not less than 0.4 eV. Note that the electronic device, etc. of the present disclosure that have such a configuration is referred, for convenience, to as "the electronic device of the (1-A)th configuration." By this, a configuration can be obtained in which an internal electric field is generated in the light emitting/light receiving layer on the basis of the difference in work function value, whereby enhancement of internal quantum efficiency is contrived. In the electronic device of the (1-A)th configuration, the thickness of the second electrode is preferably $1 \times 10^{-8}$ to $1 \times 10^{-7}$ m.

Alternatively, in the electronic device, etc. of the present disclosure that include the above-described various preferable modes, a configuration can be adopted in which the second electrode has a stacked structure of a 2B-th layer and a 2A-th layer from the light emitting/light receiving layer side, and the value of work function of the 2A-th layer of the second electrode is lower than the value of work function of the 2B-th layer of the second electrode. Note that the electronic device, etc. of the present disclosure that have such a configuration are referred, for convenience, to as "the electronic device of the (1-B)th configuration."

In the electronic device of the (1-A)th configuration, the difference between the value of work function of the second electrode and the value of work function of the first electrode is prescribed. Therefore, when a bias voltage is impressed between the first electrode and the second electrode, enhancement of internal quantum efficiency can be contrived, and generation of dark current can be restrained. In addition, in the electronic device of the (1-B)th configuration, the second electrode has the two-layer structure of the 2A-th layer and the 2B-th layer, and the difference in work function between the 2B-th layer and the 2A-th layer is prescribed. Therefore, optimization of work function in the second electrode can be contrived, and transfer (migration) of carriers is further facilitated. Then, in the production of the electronic device of the (1-A)th configuration, the value of work function of the second electrode can be controlled by controlling the oxygen gas partial pressure (oxygen gas introduction amount) at the time of formation based on a sputtering method. As a result, a large internal electric field can be generated in the light emitting/light receiving layer on the basis of the difference in work function value, and enhancement of internal quantum efficiency can be contrived. In addition, an electronic device in which generation of dark current can be restrained can be produced through a simple production process. In the production of the electronic device of the (1-B)th configuration, the work function values of the 2A-th layer and the 2B-th layer of the second electrode can be controlled by controlling the oxygen gas partial pressure (oxygen gas introduction amount) at the time of formation based on a sputtering method, and, as a result, optimization of work function of the second electrode can be contrived.

In the electronic device of the (1-B)th configuration, a configuration can be adopted in which the difference between the value of work function of the 2A-th layer of the second electrode and the value of work function of the 2B-th layer of the second electrode is 0.1 to 0.2 eV. Further, in such configurations, the difference between the work function value of the first electrode and the work function value of the 2A-th layer of the second electrode is preferably not less than 0.4 eV. Further, in the electronic device of the (1-B)th configuration that includes the above-mentioned preferred configuration, a configuration can be adopted in which the thickness of the second electrode is $1 \times 10^{-8}$ to $1 \times 10^{-7}$ m, and the ratio between the thickness of the 2A-th layer of the second electrode and the thickness of the 2B-th layer of the second electrode is from 9/1 to 1/9. Note that for reducing influences of oxygen atoms or oxygen molecules on the light emitting/light receiving layer, it is preferable that the thickness of the 2B-th layer is smaller than the thickness of the 2A-th layer of the second electrode. Further, in the electronic device of the (1-B) configuration that includes the above-mentioned preferable configuration, it is preferable to set the difference between the work function value of the first electrode and the work function value of the 2A-th layer of the second electrode to be not less than 0.4 eV, thereby generating an internal electric field in the light emitting/light receiving layer on the basis of the difference in work function, and contriving enhancement of internal quantum efficiency.

In the second electrode, a configuration may be adopted in which the content of oxygen is less than an oxygen content according to the stoichiometric composition. Alternatively, a configuration may be adopted in which the oxygen content of the 2A-th layer of the second electrode is lower then the oxygen content of the 2B-th layer of the second electrode. Then, the value of work function of the second electrode can be controlled based on the oxygen content. As the oxygen content is more lower than the oxygen content according to the stoichiometric composition, or as the oxygen deficiency increases, the value of work function is reduced.

While the value of work function of the second electrode in the electronic device of the (1-A)th configuration or the electronic device of the (1-B)th configuration that includes the above-mentioned preferable configuration is not particularly limited, a configuration may be adopted in which the work function value is, for example, 4.1 to 4.5 eV. The second electrode may include a transparent conductive material such as indium-doped gallium-zinc oxide (IGZO, In—GaZnO$_4$), aluminum oxide-doped zinc oxide (AZO), indium-zinc oxide (IZO), indium-gallium oxide (IGO), or gallium-doped zinc oxide (GZO), and the value of work function of the second electrode including such a transparent conductive material is, for example, 4.1 to 4.5 eV.

In the electronic device of the (1-A)th configuration or the electronic device of the (1-B)th configuration that includes these preferable configurations, the first electrode may include a transparent conductive material such as indium-tin oxide (ITO), indium-zinc oxide (IZO) formed under film formation conditions different from those for the second electrode, or tin oxide (SnO$_2$). Note that the value of work function of the first electrode including such a transparent conductive material is, for example, 4.8 to 5.0 eV.

Alternatively, in the electronic device, etc. of the present disclosure, the first electrode preferably includes a transparent conductive material the work function value of which is 5.2 to 5.9 eV, preferably 5.5 to 5.9 eV, more preferably 5.8 to 5.9 eV. Note that the electronic device, etc. of the present disclosure that have such a configuration are referred, for convenience, to as "the electronic device of the (1-C)th configuration." With the first electrode thus including a transparent conductive material having a work function value of 5.2 to 5.9 eV, it is possible to further enlarge the difference between the work function value of the first electrode and the work function value of the second electrode, to broaden the material choice width of the transparent conductive material constituting the second electrode, and to provide an electronic device having excellent characteristics. In the electronic device of the (1-C)th configuration, the transparent conductive material constituting such a first electrode may include a material obtained by adding at least one kind of metal species selected from the group consisting of cerium (Ce), gallium (Ga), tungsten (W) and titanium (Ti) to indium oxide in an amount of 0.5 to 10 at %, assuming that the total amount of indium atoms and the atoms of the metal species is 100 at %. Here, the term "addition" includes the concepts of mixing and doping. Besides, the resistivity (electric resistivity) of the first electrode is preferably less than $1 \times 10^{-2}$ Ω·cm. Besides, the sheet resistance of the first electrode is preferably $3 \times 10$ to $1 \times 10^3 \Omega/\square$. Further, the thickness of the first electrode is preferably $1 \times 10^{-8}$ to $2 \times 10^{-7}$ m, more preferably $2 \times 10^{-8}$ to $1 \times 10^{-7}$ m.

Alternatively, in the electronic device of the (1-C)th configuration, the transparent conductive material may include a material obtained by adding cerium (Ce) to indium oxide <indium-cerium oxide (ICO)>, and the first electrode may have a thickness of $5 \times 10^{-8}$ to $2 \times 10^{-7}$ m and have a resistivity of not less than $1 \times 10^{-3}$ Ω·cm and less than $1 \times 10^{-2}$ Ω·cm. Here, the proportion of cerium atoms is preferably 1 to 10 at %, assuming that the total amount of indium atoms and cerium atoms is 100 at %.

Alternatively, in the electronic device of the (1-C)th configuration, the transparent conductive material may include a material obtained by adding gallium (Ga) to indium oxide <indium-gallium oxide (IGO)>, and the first electrode may have a thickness of $5 \times 10^{-8}$ to $1.5 \times 10^{-7}$ m and have a resistivity of $1 \times 10^{-5}$ to $1 \times 10^{-3}$ Ω·cm. Here, the proportion of gallium atoms is preferably 1 to 30 at %, desirably 1 to 10 at %, assuming that the total amount of indium atoms and gallium atoms is 100 at %.

Alternatively, in the electronic device of the (1-C)th configuration, the transparent conductive material may include a material obtained by adding tungsten (W) to indium oxide <indium-tungsten oxide (IWO)>, and the first electrode may have a thickness of $5 \times 10^{-8}$ to $2 \times 10^{-7}$ m and have a resistivity of $1 \times 10^{-4}$ to $1 \times 10^{-3}$ Ω·cm. Here, the proportion of tungsten atoms is preferably 1 to 7 at %, assuming that the total amount of indium atoms and tungsten atoms is 100 at %.

Alternatively, in the electronic device of the (1-C)th configuration, the transparent conductive material may include a material obtained by adding titanium (Ti) to indium oxide <indium-titanium oxide (ITiO)>, and the first electrode may have a thickness of $5 \times 10^{-8}$ to $2 \times 10^{-7}$ m and have a resistivity of $1 \times 10^{-4}$ to $1 \times 10^{-3}$ Ω·cm.

Here, the proportion of titanium atoms is preferably 0.5 to 5 at %, assuming that the total amount of indium atoms and titanium atoms is 100 at %. With the proportions of cerium atoms, gallium atoms, tungsten atoms and titanium atoms thus prescribed, it is possible to obtain a desired resistivity and to contrive broadening of the transmitted light spectrum width.

In addition, in the electronic device of the (1-C)th configuration, the value of work function of the second electrode is preferably not more than 5.0 eV. As a lower limit for the value of work function of the second electrode, there can be mentioned, for example, 4.1 eV. In the electronic device of the (1-C)th configuration, the second electrode may be in a mode of including indium-tin oxide (ITO) or tin oxide ($SnO_2$). The value of work function of the second electrode including such a transparent conductive material depends on film formation conditions, and is, for example, 4.8 to 5.0 eV. Alternatively, the second electrode may include a transparent conductive material such as indium-doped gallium-zinc oxide (IGZO, $In-GaZnO_4$), aluminum oxide-doped zinc oxide (AZO), indium-zinc oxide (IZO), indium-gallium oxide (IGO), or gallium-doped zinc oxide (GZO). The value of work function of the second electrode including such a transparent conductive material depends on film formation conditions, and is, for example, 4.1 to 4.5 eV.

Alternatively, in the electronic device, etc. of the present disclosure, the second electrode may be in a mode of including a transparent, conductive and amorphous oxide. Since the second electrode is thus transparent and conductive, incident light can be reliably made to reach the light emitting/light receiving layer. Moreover, since the second electrode includes an amorphous oxide, internal stress in the second electrode is reduced, so that even without formation of a stress relaxing layer having a complicated configuration or structure, it is ensured that stress damage to the light emitting/light receiving layer is not liable to be generated at the time of formation of the second electrode, and there is no possibility of causing lowering in characteristics of the electronic device including the imaging element. Further, since the second electrode includes an amorphous oxide, sealing property is enhanced, resulting in that unevenness of sensitivity in the electronic device can be suppressed, as compared to the case where the second electrode includes a crystalline transparent electrode. Here, as aforementioned, the work function of the second electrode is preferably not more than 4.5 eV. In this case, the value of work function of the second electrode is more preferably 4.1 to 4.5 eV. Further, the electric resistance of the second electrode is desirably not more than $1 \times 10^{-6}$ Ω·cm. Alternatively, the sheet resistance of the second electrode is desirably $3 \times 10$ to $1 \times 10^3$ Ω/$\square$. In addition, it is desirable that the thickness of the second electrode is $1 \times 10^{-8}$ to $1.5 \times 10^{-7}$ m, preferably $2 \times 10^{-8}$ to $1 \times 10^{-7}$ m. Further, the second electrode may include a material obtained by adding at least one material selected from the group consisting of aluminum, gallium, tin and indium to at least one material selected from the group consisting of indium oxide, tin oxide and zinc oxide, or by doping the latter-mentioned at least one material with the former-mentioned at least one material. Alternatively, the second electrode may include an amorphous oxide including $In_a(Ga,Al)_bZn_cO_d$, namely, including an at least quaternary compound of indium (In), gallium (Ga) and/or aluminum (Al), zinc (Zn) and oxygen (O). In this case, the difference between the value of work function of the second electrode and the value of work function of the first electrode is preferably not less than 0.4 eV. Here, control of the value of work function of the second electrode can be accomplished by controlling the oxygen gas introduction amount (oxygen gas partial pressure) at the time of formation based on a sputtering method. In addition, in the case where the second electrode includes $In_a(Ga,Al)_bZn_cO_d$, a configuration may be adopted in which the second electrode has a stacked structure of a 2B-th layer and a 2A-th layer from the light emitting/light receiving layer side, and the value of work function of the 2A-th layer of the second electrode is lower than the value of work function of the 2B-th layer of the second electrode. In this case, the difference between the work function value of the 2A-th layer of the second electrode and the work function value of the 2B-th layer of the second electrode may be 0.1 to 0.2 eV. Further, the difference between the work function value of the first electrode and the work function value of the 2A-th layer of the second electrode may be not less than 0.4 eV. Alternatively, a configuration may be adopted in which with the difference between the work function value of the first electrode and the work function value of the 2A-th layer of the second electrode set to be not less than 0.4 eV, an internal electric field is generated in the light emitting/light receiving layer on the basis of the difference in work function value, thereby contriving enhancement of internal quantum efficiency. Here, such control of the work function values of the 2A-th layer and the 2B-th layer of the second electrode can be achieved by controlling the oxygen gas introduction amount (oxygen gas partial pressure) at the time of formation based on a sputtering method. In addition, a configuration may be adopted in which the thickness of the second electrode is $1 \times 10^{-8}$ to $1.5 \times 10^{-7}$ m, and the ratio between the thickness of the 2A-th layer of the second electrode and the 2B-th layer of the second electrode is from 9/1 to 1/9. Note that for reducing influences of oxygen atoms or oxygen molecules on the light emitting/light receiving layer, it is more preferable that the thickness of the 2B-th layer is smaller than the thickness of the 2A-th layer of the second electrode. With the second electrode thus having the two-layer structure of the 2A-th layer and the 2B-th layer and with the difference in work function between the 2B-th layer and the 2A-th layer thus prescribed, it is possible to contrive optimization of work function in the second electrode, whereby transfer (migration) of carriers is further facilitated.

In addition, in the electronic device, etc. of the present disclosure that include the above-described various preferable modes or configurations, a mode may be adopted in which the surface roughness (arithmetic mean roughness) Ra of the first electrode is not more than 1 nm. With the surface roughness Ra of the first electrode thus made to be not more than 1 nm, uniformization of characteristics of the light emitting/light receiving layer formed thereon and enhancement of production yield of the electronic device can be contrived. In addition, the value of Rq (root-mean-square roughness, Rms) is preferably not more than 2 nm. On the other hand, a mode is preferred in which the surface roughness Ra of the second electrode is not more than 1.5 nm, and Rq thereof is not more than 2.5 nm. Such smoothness of the second electrode can restrain surface scattering/reflection at the second electrode, and can reduce surface reflection of light incident on the second electrode, whereby it is possible to restrain light quantity loss of the light incident on the light emitting/light receiving layer through the second electrode, and to contrive enhancement of light current characteristics in photoelectric conversion. The surface roughnesses Ra and Rq are based on the prescriptions in JIS B0601:2013.

In the electronic device, etc. of the present disclosure that include the above-described various preferable modes or configurations, a configuration may be adopted in which, for example, the first electrode is formed on a substrate, the light emitting/light receiving layer is formed on the first electrode, and the second electrode is formed on the light emitting/light receiving layer. In other words, the electronic device, etc. of the present disclosure have a two-terminal-type electronic device structure including a first electrode and a second electrode. It is to be noted, however, that this is not restrictive, and the electronic device, etc. of the present disclosure may have a three-terminal-type electronic device structure that further includes a control electrode; in that case, modulation of a flowing current can be performed by impressing a voltage on the control electrode. Specific examples of the three-terminal-type electronic device structure include the same configurations or structures as field effect transistors (FET) of so-called bottom-gate/bottom contact type, bottom-gate/top contact type, top-gate/bottom-contact type, and top-gate/top-contact type. Note that the second electrode can be made to function as a cathode electrode (cathode) (namely, to function as an electrode for taking out electrons), while the first electrode can be made to function as an anode electrode (anode) (namely, to function as an electrode for taking out holes). A structure may be adopted in which a plurality of electronic device, etc. having light emitting/light receiving layers which are different in light absorption spectrum are stacked. In addition, a structure may be adopted in which, for example, a substrate is a silicon semiconductor substrate, the silicon semiconductor substrate is preliminarily provided with a driving circuit for the electronic device, etc. and the light emitting/light receiving layer, and the electronic device, etc. is stacked on the silicon semiconductor substrate.

In the electronic device, etc. of the present disclosure that include the above-described preferable modes or configurations, the light emitting/light receiving layer may be in an amorphous state or in a crystalline state. Examples of the organic material (organic photoelectric conversion material) for constituting the light emitting/light receiving layer include organic semiconductor materials, organometallic compounds, and organic semiconductor particulates. Alternatively, examples of the material for constituting the light emitting/light receiving layer include metal oxide semiconductors, inorganic semiconductor particulates, materials in which a core member is covered with a shell member, and organic-inorganic hybrid compounds. Note that the electronic device, etc. of the present disclosure having such a configuration (inclusive of the electronic device of the (1-A)th configuration, the electronic device of the (1-B)th configuration, and the electronic device of the (1-C)th configuration) are referred, for convenience, to as "the electronic device of the (1-D)th configuration."

Here, specific examples of the organic semiconductor materials include organic coloring matters represented by quinacridone and its derivatives, coloring matters in which a former-period (referring to metals on the left side in the Periodic Table) ion is chelated with an organic material represented by Alq3[tris(8-quinolinolato)aluminum(III)], organometallic coloring matters obtained through complex formation by a transition metal ion and an organic material represented by phthalocyanine zinc (II), and dinaphthothienothiophene (DNTT).

In addition, specific examples of the organometallic compounds include coloring matters in which the aforementioned former-period ion is chelated with an organic material, and organometallic coloring matter formed through complex formation by a transition metal ion and an organic material. Specific examples of the organic semiconductor particulates include associated bodies of the aforementioned organic coloring matters represented by quinacridone and its derivatives, associated bodies of coloring matters in which a former-period ion is chelated with an organic material, associated bodies of organometallic coloring matters obtained through complex formation by a transition metal ion and an organic material, or Prussian blue in which a metallic ion is crosslinked by cyano group and its derivatives, or complex associated bodies of these.

Specific examples of the metal oxide semiconductors or inorganic semiconductor particulates include ITO, IGZO, ZnO, IZO, $IrO_2$, $TiO_2$, $SnO_2$, $SiO_x$, metal chalcogen semiconductors containing chalcogen [for example, sulfur (S), selenium (Se), tellurium (Te)] (specifically, CdS, CdSe, ZnS, CdSe/CdS, CdSe/ZnS, PbSe), ZnO, CdTe, GaAs, and Si.

Specific examples of the materials in which a core member is covered with a shell member, or a combination of (core member, shell member), include organic materials such as (polystyrene, polyaniline) and metallic materials such as (difficulty ionizable metallic materials, easily ionizable metallic materials). Specific examples of the organic-inorganic hybrid compounds include Prussian blue in which a metallic ion is crosslinked by cyano group and its derivatives. Other than the above, specific examples include coordination polymers which is the generic name of compounds in which a metallic ion is indefinitely crosslinked by bipyridines and compounds in which a metallic ion is crosslinked by a polyvalent ionic acid represented by oxalic acid and rubeanic acid.

Examples of the method for forming the light emitting/light receiving layer in the electronic device of the (1-D)th configuration, which depends on the materials used, include coating methods, physical vapor deposition methods (PVD methods), and various chemical vapor deposition methods (CVD methods) including MOCVD method. Here, specific examples of the coating methods include spin coating method; immersion method; casting method; various printing methods such as screen printing method, ink jet printing method, offset printing method, and gravure printing method; stamping method; spraying method; and various coating methods such as air doctor coater method, blade coater method, rod coater method, knife coater method, squeeze coater method, reverse roll coater method, transfer roll coater method, gravure coater method, kiss coater method, cast coater method, spray coater method, slit orifice coater method, and calendar coater method. Note that in the coating methods, examples of solvent include nonpolar or lowly polar organic solvents such as toluene, chloroform, hexane and ethanol. In addition, examples of the PVD methods include various vacuum vapor deposition methods such as electron beam heating method, resistance heating method, and flash evaporation; plasma vapor deposition method; various sputtering methods such as bipolar sputtering method, direct current sputtering method, direct current magnetron sputtering method, high-frequency sputtering method, magnetron sputtering method, ion beam sputtering method, and bias sputtering method; and various ion plating methods such as DC (direct current) method, RF method, multiple cathode method, activation reaction method, electric field vapor deposition method, high-frequency ion plating method, and reactive ion plating method.

Besides, in the electronic device of the (1-D)th configuration, the thickness of the light emitting/light receiving layer is not restricted, and may be, for example, $1 \times 10^{-10}$ to $5 \times 10^{-7}$ m.

Further, in the electronic device of the (1-D)th configuration, examples of the substrate include organic polymers (having the form of a polymeric material such as flexible plastic film, plastic sheet or plastic substrate including a polymeric material) such as, for example, polymethyl methacrylate (PMMA), polyvinyl alcohol (PVA), polyvinyl phenol (PVP), polyether sulfone (PES), polyimide, polycarbonate (PC), polyethylene terephthalate (PET), and polyethylene naphthalate (PEN). When such a flexible substrate including a polymeric material is used, it is possible, for example, to incorporate or integrate the electronic device into an electronic apparatus having a curved surface shape. Alternatively, examples of the substrate include various glass substrates, various glass substrates with an insulating film formed on a surface thereof, quartz substrate, quartz substrate with an insulating film formed on a surface thereof, silicon semiconductor substrate, silicon semiconductor substrate with an insulating film formed on a surface thereof, and metallic substrates including various alloys such as stainless steel or various metals. Note that examples of the insulating film include silicon oxide materials (e.g., $SiO_x$ or spin-on glass (SOG)); silicon nitrides ($SiN_y$); silicon oxynitride (SiON); aluminum oxide ($Al_2O_3$); metal oxides and metal salts. In addition, conductive substrates (substrates including a metal such as gold and aluminum, substrates including a highly oriented graphite) with such an insulating film formed on a surface thereof can also be used. While the surface of the substrate is desirably smooth, it may have roughness in such an extent as not to adversely influence the characteristics of the light emitting/light receiving layer. Adhesion between the first electrode or the second electrode and the substrate may be enhanced by forming a silanol derivative by a silane coupling method, forming a thin film including a thiol derivative, a carboxylic acid derivative, a phosphoric acid derivative or the like by SAM method or the like, or forming a thin film including an insulating metal salt or metal complex by CVD method or the like, on the surface of the substrate.

The first electrode, the second electrode and the insulating layer are formed based on a sputtering method, specific examples of which include magnetron sputtering method and parallel plate sputtering method, and include plasma generation forming methods using a DC discharge system or an RF discharge system. Alternatively, examples of the method for forming the first electrode, which depends on the material for constituting the first electrode, include PVD methods such as vacuum vapor deposition method, reactive vapor deposition method, various sputtering methods, electron beam vapor deposition method, ion plating method, etc., pyrosol process, method of pyrolyzing an organometallic compound, spraying method, dipping method, various CVD methods including MOCVD method, electroless plating method, and electrolytic plating method. Note that in a preferable configuration of the present disclosure, by oxygen flow rate (oxygen gas partial pressure, oxygen gas introduction amount), it is possible to control the work function and to contrive control and enhancement of the characteristics of the electrodes. Specifically, for example, it is possible to control resistivity of the electrodes and to contrive broadening of the transmitted light spectrum width in the electrodes.

Though not indispensable, it is preferable to subject the first electrode to a surface treatment after the formation of the first electrode and before the formation of the light emitting/light receiving layer on the first electrode. Examples of the surface treatment include irradiation with UV rays and an oxygen plasma treatment. By applying the surface treatment, it is possible to remove contaminants from the surface of the first electrode, and to contrive enhancement of adhesion of the light emitting/light receiving layer at the time of forming the light emitting/light receiving layer on the first electrode. Moreover, with the first electrode subjected to the surface treatment, the state of oxygen deficiency in the first electrode is changed (specifically, oxygen deficiency is decreased), and the value of work function of the first electrode can be increased.

The oxygen gas partial pressure at the time of forming the insulating layer on the basis of a sputtering method, which is not restricted, is preferably 0.06 to 0.10 Pa. In addition, in such a preferable mode, the temperature at the time of forming the insulating layer on the basis of a sputtering method (film formation temperature) is preferably room temperature or 22° C. to 28° C.

In the electronic device, etc. of the present disclosure that include the above-described various preferable modes or configurations, the reception or emission/reception of light (broadly, electromagnetic waves, and including visible light, UV rays and IR rays) in the light emitting/light receiving layer may be conducted through the second electrode or may be performed through the first electrode. In the latter case, a substrate transparent to the light to be emitted/received should be used.

The insulating material of the present disclosure may be applied to formation of an insulating layer in a light emitting/light receiving element, specifically, a semiconductor light emitting element such as an end face emission type semiconductor laser element, end face emission type superluminescent diode (SLD), surface-emitting laser element (vertical resonator laser, also called VCSEL), light emitting diode (LED), etc., or semiconductor light amplifier, or formation of an insulating layer in solar cells or photosensors. The semiconductor light amplifier amplifies an optical signal directly in the state of light, without converting the optical signal into an electrical signal, has a laser structure in which a resonator effect is excluded as securely as possible, and amplifies incident light on the basis of optical gain of the semiconductor light amplifier. In the semiconductor laser element, optimization of light reflectance on a first end face and light reflectance on a second end face is contrived, whereby a resonator is configured, and light is emitted from the first end face. On the other hand, in the superluminescent diode, light reflectance on a first end face is set at a very low value, whereas light reflectance on a second end face is set at a very high value, and, without configuring a resonator, light generated in an active layer is reflected on the second end face and is emitted from the first end face. In the semiconductor laser element and the superluminescent diode, an antireflection coating layer (AR) or a lowly reflective coating layer is formed on the first end face, whereas a highly reflective coating layer (HR) is formed on the second end face. In addition, in the semiconductor light amplifier, light reflectance on the first end face and the second end face is set at a very low value, and, without configuring a resonator, light incident from the second end face is amplified and is emitted from the first end face. In the surface-emitting laser element, light is resonated between two light reflection layers (Distributed Bragg Reflector layers, DBR layers), whereby laser oscillation is generated.

By the electronic device of the present disclosure, not only an imaging apparatus such as television camera but also a photosensor and an image sensor can be configured.

Example 1

Figure 1B:
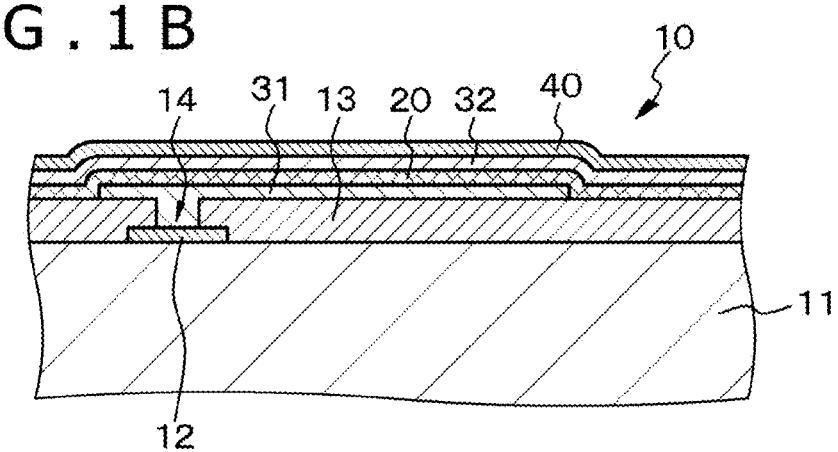

Example 1 relates to the electronic device of the present disclosure and the insulating material of the present disclosure, and, further, relates to the electronic device of the (1-D)th configuration. A schematic sectional view of the electronic device of Example 1 is depicted in FIG. 1B. The electronic device of Example 1 constitutes a photoelectric conversion element.

The electronic device of Example 1, or Examples 2 to 4 which will be described later, includes a first electrode 31, a light emitting/light receiving layer 20 formed on the first electrode 31, and a second electrode 32 formed on the light emitting/light receiving layer 20. The second electrode 32, for example, includes a conductive amorphous oxide which includes an at least quaternary compound of indium (In), gallium (Ga) and/or aluminum (Al), zinc (Zn) and oxygen (O). In addition, the light emitting/light receiving layer 20 and/or the second electrode 32 is covered by an insulating layer 40. The insulating layer 40 or the insulating material includes a metal oxide that contains, as a main component, zinc oxide, while containing, as accessory components, at least two materials selected from the group consisting of aluminum oxide, magnesium oxide, niobium oxide, titanium oxide, molybdenum oxide and hafnium oxide. Specifically, the content of the accessory components is 5 to 30 at %, on a metallic atom basis. More specifically, the accessory components include aluminum oxide and magnesium oxide. The insulating layer 40 also include an amorphous oxide which is transparent, amorphous and insulating. An exemplary composition of the insulating layer 40 or the insulating material is indicated in Table 1 below. The insulating layer 40 functions as a kind of protective layer.

TABLE 1

|  | at % |
| --- | --- |
| Zinc | 75 |
| Aluminum | 15 |
| Magnesium | 10 |

More specifically, in the electronic device of Example 1, or Examples 2 and 3 which will be described later, the second electrode 32 includes a transparent conductive material such as indium-doped gallium-zinc oxide (IGZO, In—GaZnO$_4$). That is, the second electrode 32 includes In$_a$(Ga, Al)$_b$Zn$_c$O$_d$. In other words, the second electrode 32 includes an amorphous oxide which includes an at least quaternary compound [In$_a$(Ga,Al)$_b$Zn$_c$O$_d$] of indium (In), gallium (Ga) and/or aluminum (Al), zinc (Zn) and oxygen (O). Here, "a," "b," "c" and "d" can take various values. An exemplary value of "a" is 0.05 to 0.10, an exemplary value of "b" is 0.10 to 0.20, an exemplary value of "c" is 0.10 to 0.20, and an exemplary value of "d" is 0.30 to 0.40, these values being nonrestrictive. Note that the second electrode 32 may include not only indium-doped gallium-zinc oxide (IGZO) but also aluminum oxide-doped zinc oxide (AZO), indium-zinc oxide (IZO), indium-gallium oxide (IGO), or gallium-doped zinc oxide (GZO).

Figure 3:
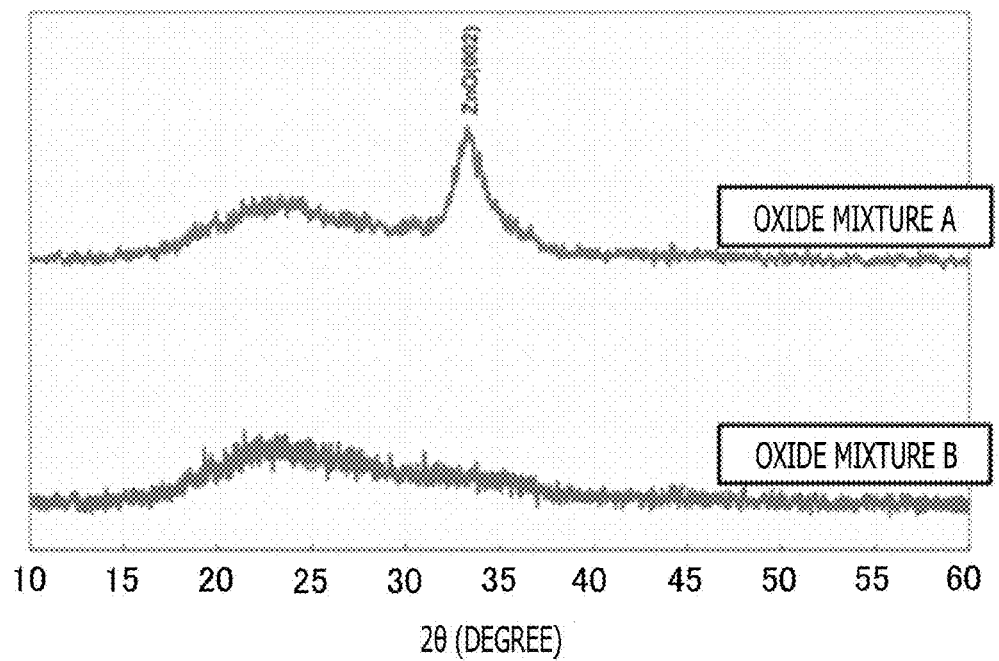
FIG. 3 is a diagram depicting X-ray diffraction results of a thin film including zinc oxide, and X-ray diffraction results of a thin film of an insulating material of Example 1 which includes a ternary metal oxide of zinc oxide, aluminum oxide and magnesium oxide.

The results of X-ray diffraction conducted on a thin film including zinc oxide on the basis of a sputtering method with zinc oxide as a target and the results of X-ray diffraction performed on a thin film of Example 1 including a ternary metal oxide of zinc oxide, aluminum oxide and magnesium oxide (hereinafter referred, for convenience, to as the "insulating material thin film") are depicted in FIG. 3. Note that in FIG. 3, "oxide mixture A" indicates data on the thin film including zinc oxide, and "oxide mixture B" indicates data on the insulating material thin film. It is seen from FIG. 3 that the zinc oxide thin film has a microcrystalline structure, whereas the insulating material thin film is amorphous.

In the electronic device 10 of Example 1, the first electrode 31 includes a transparent conductive material such as, for example, indium-tin oxide (ITO), and the light emitting/light receiving layer 20 includes an organic photoelectric conversion material, specifically, quinacridone with a thickness of 0.1 μm, for example. The light emitting/light receiving layer 20 is sandwiched between the first electrode 31 and the second electrode 32. In other words, the first electrode 31, the light emitting/light receiving layer 20 and the second electrode 32 are stacked in this order. To be more specific, in the electronic device 10 of Example 1, the first electrode 31 is formed on a substrate 11 that is a silicon semiconductor substrate, the light emitting/light receiving layer 20 is formed on the first electrode 31, and the second electrode 32 is formed on the light emitting/light receiving layer 20. In other words, the electronic device 10 of Example 1, or Examples 2 to 4 which will be described later, has a two-terminal type electronic device structure provided with the first electrode 31 and the second electrode 32. In the light emitting/light receiving layer 20, specifically, photoelectric conversion is performed. In other words, the electronic device 10 of Example 1, or Examples 2 to 4 which will be described later, includes a photoelectric conversion element. Other examples of the material constituting the first electrode 31 include such transparent conductive materials as indium-zinc oxide (IZO) and tin oxide ($SnO_2$) which are formed under film formation conditions different from those for the second electrode 32.

The light transmittance of the insulating layer 40 to light of a wavelength of 400 to 660 nm is not less than 80%; specifically, the light transmittance is 90% to light of wavelength of 550 nm. The light transmittance of the second electrode 32 to light of a wavelength of 400 to 660 nm is not less than 75%; specifically, the light transmittance is 85% to light of a wavelength of 550 nm. The light transmittance of the first electrode 31, the second electrode 32 and the insulating layer 40 can be measured by forming the first electrode 31, the second electrode 32 or the insulating layer 40 on a transparent glass plate. In addition, the sheet resistance of the second electrode 32 is $3\times10$ to $1\times10^3 \Omega/\square$, specifically, $8\times10 \Omega/\square$. Further, the sheet resistance of the insulating layer 40 is not less than $1\times10^5 \Omega/\square$, specifically, $6.4\times10^6 \Omega/\square$. Besides, the thickness of the insulating layer 40 on the second electrode 32 is $5\times10^{-5}$ to $7\times10^{-7}$ m, preferably $1.5\times10^{-7}$ to $7\times10^{-7}$ m, and more preferably $3\times10^{-7}$ to $7\times10^{-7}$ m.

Figure 4:
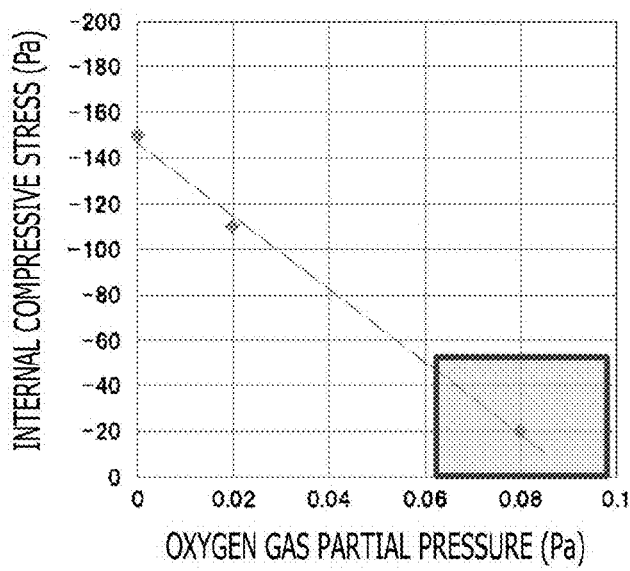
FIG. 4 is a graph depicting the results of examination of the relation between oxygen gas partial pressure and internal stress of a thin film obtained, at the time of forming a thin film of the insulating material of Example 1 which includes the ternary metal oxide of zinc oxide, aluminum oxide and magnesium oxide.

An insulating material thin film was formed based on a sputtering method at a film formation temperature of room temperature (or 22° C. to 28° C.). Then, the relation between oxygen gas partial pressure at the time of film formation and internal stress in the insulating material thin film obtained was examined, the results being depicted in FIG. 4. A parallel plate sputtering apparatus or a DC magnetron sputtering apparatus was used as a sputtering apparatus, argon (Ar) gas was used as a process gas, and a sintered body of zinc oxide, aluminum oxide and magnesium oxide was used as a target. The same applies to the formation of the insulating layer 40 which will be described below. The internal stress was measured based on a known method using a commercial thin film stress measuring apparatus. It is seen from FIG. 4 that as the oxygen gas partial pressure at the time of film formation rises, the value of the internal stress (compressive stress) in the insulating material thin film or the insulating layer 40 obtained decreases.

From various test results, it was found preferable that the absolute value of the internal stress in the insulating layer 40 is not more than 50 MPa, specifically, the compressive stress or tensile stress is not more than 50 MPa, or the compressive stress in the insulating layer 40 is not more than 50 MPa. It was also found that for achieving this, it is preferable to control the compositional proportion of oxygen (O) in the insulating layer 40 by controlling the oxygen gas partial pressure (oxygen gas introduction amount) at the time of forming the insulating layer 40 on the basis of a sputtering method. Specifically, it was found that for causing the compressive stress in the insulating layer 40 to be not more than 50 MPa, it is preferable to set the oxygen gas partial pressure at the time of forming the insulating layer 40 to a value of not less than 0.06 Pa and not more than 0.1 Pa (see FIG. 4).

A method of producing the electronic device of Example 1 will be described below. The electronic device 10 obtained by the method of producing the electronic device of Example 1 constitutes a photoelectric conversion element.

[Step 100]

A substrate 11 that is a silicon semiconductor substrate is prepared. Here, the substrate 11 is provided, for example, with a driving circuit for an electronic device, a photoelectric conversion layer (not depicted) and a wiring 12, and an interlayer insulating film 13 is formed on a surface thereof. The interlayer insulating film 13 is provided at a bottom portion thereof with an opening 14 where the wiring 12 is exposed. A first electrode 31 including ITO is formed (film formation) on the interlayer insulating film 13 inclusive of the inside of the opening 14 based on a sputtering method. In this way, a structure depicted in FIG. 1A can be obtained.

[Step 110]

Next, patterning of the first electrode 31 is performed, after which a light emitting/light receiving layer 20 including quinacridone is formed (film formation) on the whole surface by a vacuum vapor deposition method. The light emitting/light receiving layer 20 thus formed may be or may not be patterned.

[Step 120]

Thereafter, a second electrode 32 including a conductive amorphous oxide (specifically, including IGZO) is formed on the light emitting/light receiving layer 20 on the basis of a sputtering method at a film formation temperature of room temperature (or 22° C. to 28° C.) while using a parallel plate sputtering apparatus or a DC magnetron sputtering apparatus as a sputtering apparatus and using argon (Ar) gas as a process gas, after which the second electrode 32 is patterned into a desired shape on the basis of a known patterning technique. Note that the patterning of the second electrode 32 is not indispensable.

[Step 130]

Subsequently, with the sputtering conditions changed, an insulating layer 40 is formed (film formation) on the whole surface at a film formation temperature of room temperature (or 22° C. to 28° C.). Specifically, based on a sputtering method, the second electrode 32 is covered by the insulating layer 40 including an insulating amorphous oxide (specifically, including an insulating material thin film). In this way, an electronic device of Example 1 which has the structure depicted in FIG. 1B can be obtained.

For Example 1A in which the thickness of the insulating layer 40 on the second electrode 32 is 0.5 μm, Example 1B in which the thickness of the insulating layer 40 on the second electrode 32 is 0.7 μm, and Comparative Example 1 constituted of an electronic device in which the insulating layer is not formed, respective values of internal quantum efficiency were determined, and variations in relative value of internal quantum efficiency when each electronic device is left to stand in a room were determined. The results are set forth in Table 2 below. The relative value of internal quantum efficiency is a value when assuming that an initial value (a value before left to stand) of internal quantum efficiency is 100%. The internal quantum efficiency η is the ratio of the number of electrons generated to the number of incident photons, and can be represented by the following expression.

$$\eta = \{(h \cdot c)/(q \cdot \lambda)\}(I/P) = (1.24/\lambda)(I/P)$$

where
h: Plank constant
c: velocity of light
q: electric charge of electron
λ: wavelength (μm) of incident light
I: light current, and, in measurement in Example 1, current value (ampere/cm$^2$) obtained at a reverse bias voltage of 1 volt
P: power (ampere/cm$^2$) of incident light

TABLE 2

|  | Relative value of internal quantum efficiency (%) | | |
| --- | --- | --- | --- |
|  | Initial Value | After left to stand for 2 hours | After left to stand for 170 hours |
| Example 1A | 100 | 100 | 97 |
| Example 1B | 100 | 98 | 95 |
| Comparative Example 1 | 100 | 97 | 10 |

In addition, with a reverse bias voltage set at 2.6 volts, dark current was measured. In the electronic devices of Example 1A and Example 1B, the initial value of dark current, the value of dark current after left to stand for 2 hours and the value of dark current after left to stand for 170 hours were 1×10$^{-10}$ ampere/cm$^2$, without any change. On the other hand, in Comparative Example 1, the initial value of dark current and the value of dark current after left to stand for 2 hours was 1×10$^{-10}$ ampere/cm$^2$, but the value of dark current after left to stand for 170 hours showed an increase to 9×10$^{-8}$ ampere/cm$^2$.

Thus, in Example 1, the composition of the insulating layer or the insulating material thin film is prescribed, and the second electrode and the insulating layer can be formed based on a sputtering method; therefore, an electronic device can be produced through a more rational method. Moreover, since the electronic device can be produced through a process at a low temperature of 22° C. to 28° C., thermal deterioration of the light emitting/light receiving layer can be prevented. Further, since the compressive stress in the insulating layer can be made to be not more than 50 MPa, or the film stress of the insulating layer can be suppressed, by controlling the compositional proportion of oxygen at the time of film formation, specifically, by setting the oxygen gas partial pressure (oxygen gas introduction amount) at the time of forming the insulating layer on the basis of a sputtering method at a value of, for example, 0.06 to 0.10 Pa, it is possible to provide an electronic device having high reliability. Moreover, since the insulating layer includes an insulating amorphous oxide, a high sealing property can be imparted to the electronic device. As a result, time variation of characteristics of the electronic device (for example, time variation of the aforementioned internal quantum efficiency) can be suppressed, and it is possible to provide an electronic device having high durability.

Figure 1C:
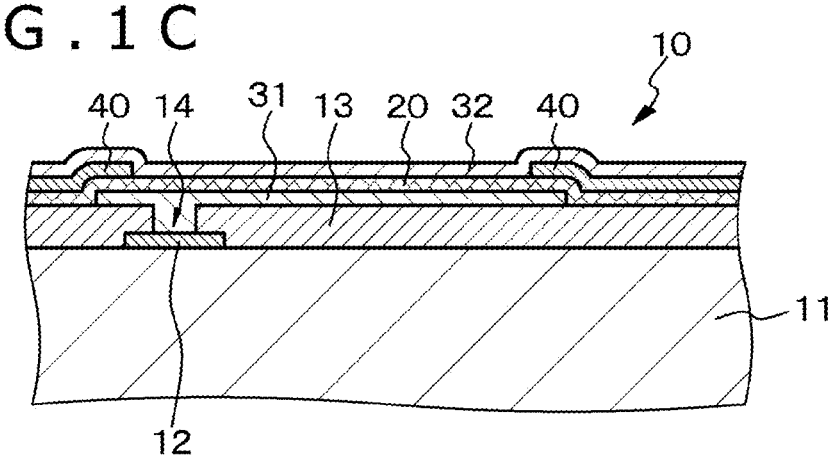
FIG. 1C is a schematic partial sectional view of a modification of the electronic device of Example 1.

Note that after the insulating layer 40 including the insulating material thin film is formed on the light emitting/light receiving layer 20 on the basis of a sputtering method, that part of the insulating layer 40 at which the second electrode 32 is to be formed is removed based on a known patterning technique, thereby exposing a part of the light emitting/light receiving layer 20. Next, with the sputtering conditions changed, the second electrode 32 including a conductive amorphous oxide (specifically, including IGZO) is formed on the whole surface, after which the second electrode 32 is patterned into a desired shape on the basis of a known patterning technique. In this way, the electronic device of Example 1 having the structure depicted in FIG. 1C in which the light emitting/light receiving layer 20 is covered by the insulating layer 40 including the insulating material thin film can be obtained. Thus, the insulating layer 40 may be formed on the upper side of, or may be formed on the lower side of, the second electrode 32.

Example 2

Example 2 is a modification of Example 1, and relates to the electronic device of the (1-A)th configuration and the electronic device of the (1-D)th configuration. Specifically, in the electronic device of Example 2, the difference between the value of work function of the second electrode 32 and the value of work function of the first electrode 31 is not less than 0.4 eV. Here, with the difference between the work function value of the second electrode 32 and the work function value of the first electrode 31 set to be not less than 0.4 eV, an internal electric field is generated in the light emitting/light receiving layer 20 on the basis of the difference in work function value, whereby enhancement of internal quantum efficiency is contrived. The second electrode 32 functions as a cathode electrode (cathode). In other words, it functions as an electrode for taking out electrons. On the other hand, the first electrode 31 functions as an anode electrode (anode). In other words, it functions as an electrode for taking out holes. Here, the work function of IGZO constituting the second electrode 32, which depends on film formation conditions, is 4.1 to 4.2 eV. In addition, the work function of ITO constituting the first electrode 31, which depends on film formation conditions, is, for example, 4.8 to 5.0 eV.

Specifically, the value of work function of the second electrode 32 is controlled by controlling the oxygen gas introduction amount (oxygen gas partial pressure) at the time of forming the second electrode 32 on the basis of a sputtering method. An example of the results of determination of the relation between oxygen gas partial pressure and the value of work function of the second electrode 32 is depicted in a graph in FIG. 5. It is seen that as the value of oxygen gas partial pressure is raised, or as oxygen deficiency decreases, the value of work function of the second electrode 32 increases, and that as the value of oxygen gas partial pressure is lowered, or as the oxygen deficiency increases, the value of work function of the second electrode 32 decreases.

Thus, in the electronic device of Example 2, the value of work function of the second electrode 32 is controlled by controlling the oxygen gas introduction amount (oxygen gas partial pressure) at the time of forming the second electrode 32 on the basis of a sputtering method. Note that in the second electrode 32, the content of oxygen is lower than the oxygen content according to the stoichiometric composition.

Figure 6A:
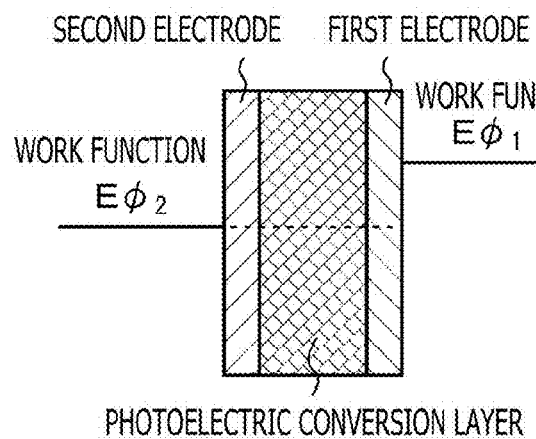
FIGS. 6A and 6B are conceptual figures of energy diagram in electronic devices of Example 2 and Comparative Example 2.
Figure 6B:
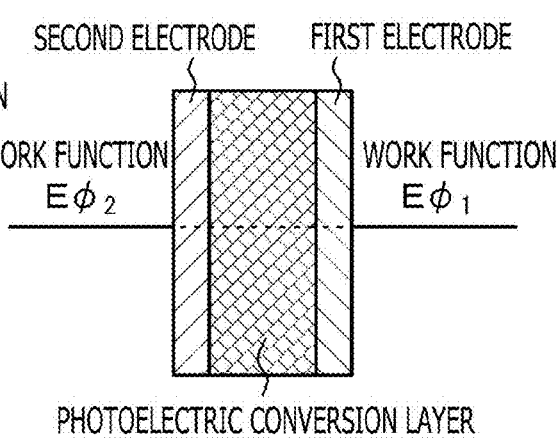
Figure 6C:
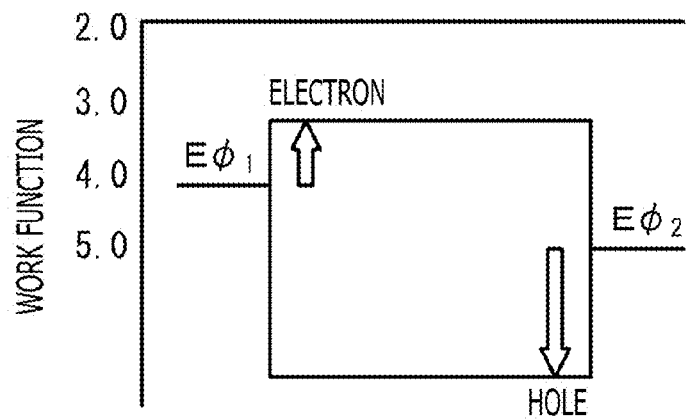
FIGS. 6C and 6D are conceptual figures depicting the correlation between work function value difference and energy diagram in the electronic devices of Example 2 and Comparative Example 2.
Figure 6D:
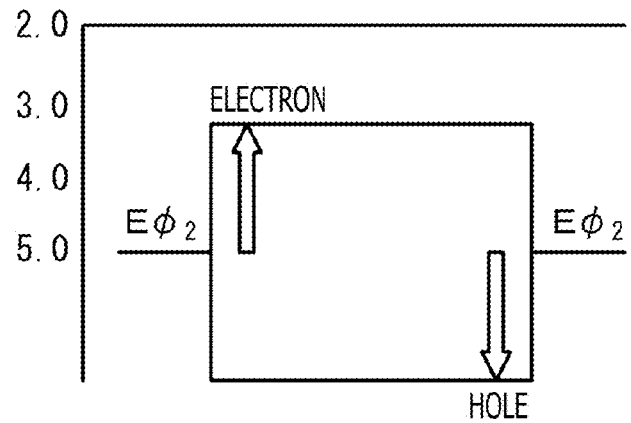

In the electronic device of Comparative Example 2, both the first electrode and the second electrode included ITO. Therefore, as a conceptual figure of energy diagram is depicted in FIG. 6B, there is no difference between the value of work function of the second electrode and the value of work function of the first electrode. For this reason, holes are liable to flow from the second electrode into the first electrode, with the result that dark current increases. In addition, since there is no difference between the work function value of the second electrode and the work function value of the first electrode, no potential gradient exists (or no internal electric field is generated in the light emitting/light receiving layer) at the time of taking out of electrons and holes, so that it is difficult to smoothly take out electrons and holes (see a conceptual figure in FIG. 6D). On the other hand, in the electronic device of Example 2, the second electrode includes IGZO, while the first electrode includes ITO, and the difference between the value of work function of the second electrode and the value of work function of the first electrode is not less than 0.4 eV. A conceptual figure of the energy diagram is depicted in FIG. 6A. Therefore, flowing of holes from the first electrode into the second electrode can be prevented, with the result that generation of dark current can be restrained. In addition, since the difference between the work function value of the second electrode and the work function value of the first electrode is not less than 0.4 eV, a potential gradient is generated (or an internal electric field is generated in the light emitting/light receiving layer) at the time of taking-out of electrons and holes, so that smooth taking-out of electrons and holes can be performed through application of this potential gradient (see a conceptual figure in FIG. 6C).

Figure 7A:
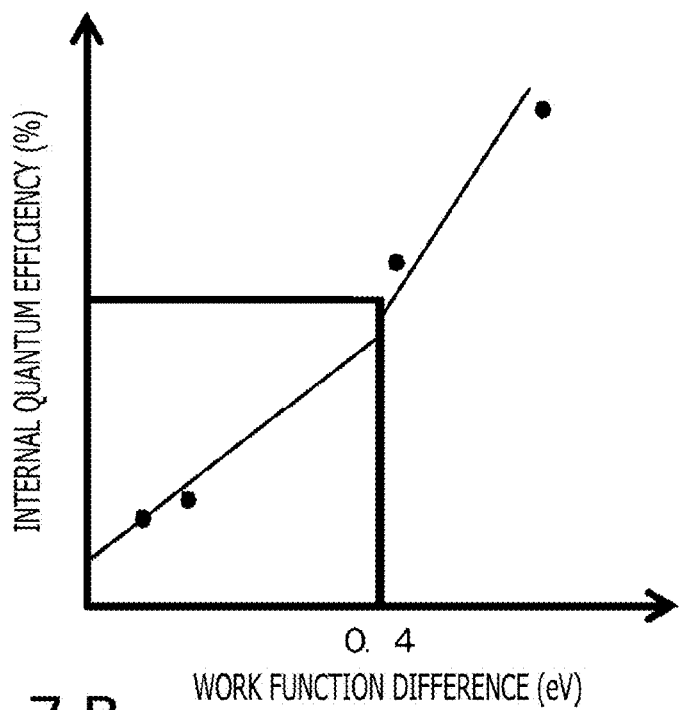
FIGS. 7A and 7B are graphs depicting the correlation between internal quantum efficiency and work function value difference and the correlation between dark current and the work function value difference in the electronic device of Example 2.
Figure 7B:
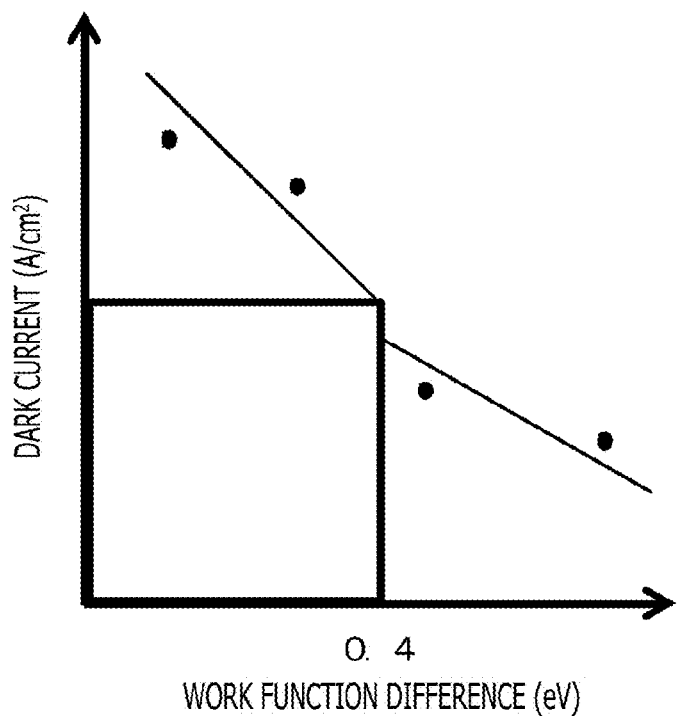
Figure 8A:
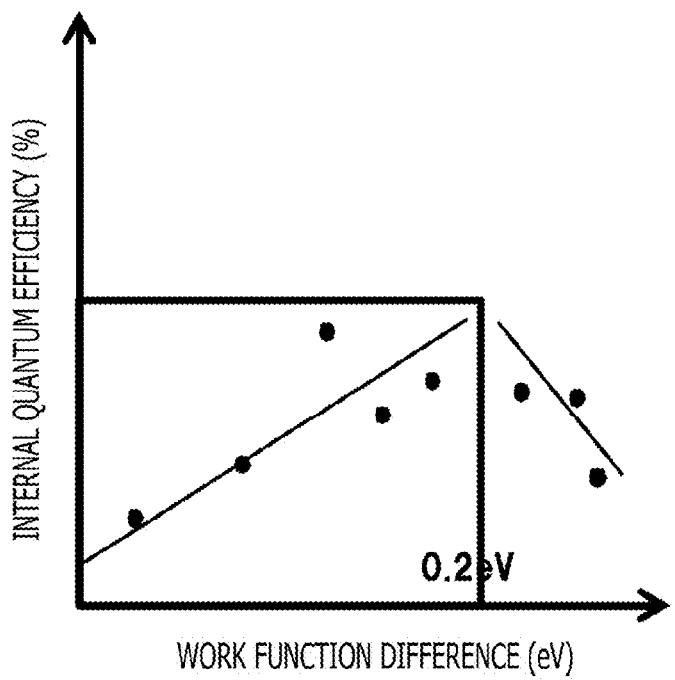
FIGS. 8A and 8B are graphs depicting the correlation between internal quantum efficiency and work function value difference and the correlation between dark current and work function value difference in the electronic device of Example 3.
Figure 8B:
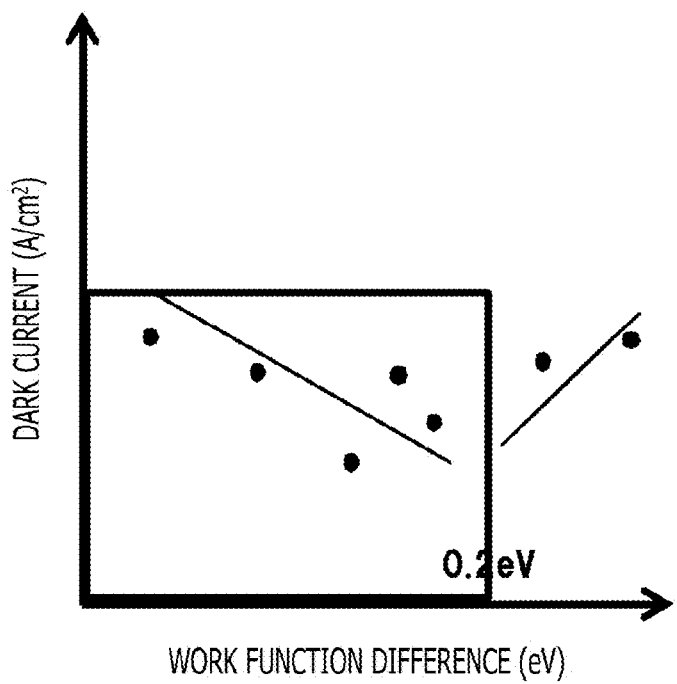

Further, the results of examination of the correlation between internal quantum efficiency and work function value are depicted in a graph in FIG. 7A, and the results of examination of the correlation between dark current (in the measurement in Example 2, a current value obtained without irradiation with light at a reverse bias voltage of 1 volt) and work function value are depicted in a graph in FIG. 7B. Note that the axis of abscissas in FIGS. 7A and 7B represents the difference between the value of work function of the second electrode 32 and the value of work function of the first electrode 31, whereas the axis of abscissas in FIGS. 8A and 8B represents the difference between the value of work function of the 2B-th layer of the second electrode 32 and the value of work function of the 2A-th layer of the second electrode. From FIGS. 7A and 7B, a clear increase in internal quantum efficiency and a clear lowering in dark current were observed, with a work function difference of around 0.4 eV as a boundary.

As described above, in the electronic device of Example 2, the difference between the value of work function of the second electrode and the value of work function of the first electrode is prescribed. Therefore, when a bias voltage (specifically, a reverse bias voltage) is impressed between the first electrode and the second electrode, a large internal electric field can be generated in the light emitting/light receiving layer on the basis of the difference in work function value. As a result, enhancement of internal quantum efficiency can be contrived, or an increase in photoelectric current can be contrived, and, in addition, generation of dark current can be restrained. In the production of the electronic device of Example 2, the value of work function of the second electrode can be controlled by controlling the oxygen gas introduction amount (oxygen gas partial pressure) at the time of formation based on a sputtering method. As a result, a large internal electric field can be generated in the light emitting/light receiving layer on the basis of the difference in work function value. Accordingly, enhancement of internal quantum efficiency can be contrived, or an increase in photoelectric current can be contrived. In addition, an electronic device in which generation of dark current can be restrained can be produced through a simple production process.

Example 3

Figure 2:
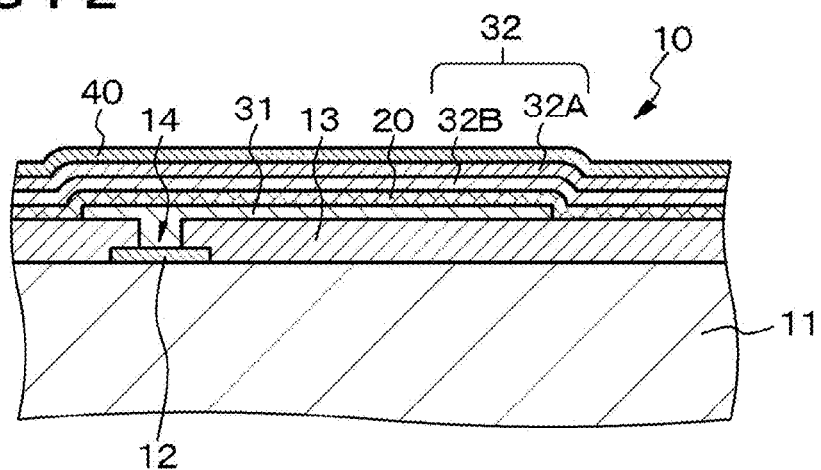
FIG. 2 is a schematic partial sectional view of an electronic device of Example 3.

Example 3 is a modification of Example 2, and relates to the electronic device of the (1-B)th configuration and the electronic device of the (1-D)th configuration. Specifically, in the electronic device of Example 3, a second electrode 32 has a stacked structure of a 2B-th layer 32A and a 2A-th layer 32B from the side of a light emitting/light receiving layer 20, and the value of work function of the 2B-th layer 32A of the second electrode 32 is lower than the value of work function of the 2B-th layer 32B of the second electrode 32. A schematic partial sectional view of the electronic device of Example 3 is depicted in FIG. 2.

Specifically, the difference between the work function value of the 2A-th layer 32A of the second electrode 32 and the work function value of the 2B-th layer 32B of the second electrode 32 is 0.1 to 0.2 eV, more specifically 0.15 eV, and the difference between the work function value of a first electrode 31 and the work function value of the 2A-th layer 32A of the second electrode 32 is not less than 0.4 eV. In addition, the thickness of the second electrode 32 is $1 \times 10^{-8}$ to $1 \times 10^{-7}$ m, specifically 50 nm, and the ratio of the thickness of the 2A-th layer 32A of the second electrode 32 and the thickness of the 2B-th layer 32B of the second electrode layer 32 is from 9/1 to 1/9, specifically 9/1. In Example 3, also, the difference between the work function value of the first electrode 31 and the work function value of the 2A-th layer 32A of the second electrode 32 is set to be not less than 0.4 eV, whereby an internal electric field is generated in the light emitting/light receiving layer on the basis of the difference in work function value, and enhancement of internal quantum efficiency is contrived. Here, let the composition of the 2A-th layer 32A be $In_a(Ga,Al)_b Zn_c O_d$ and let the composition of the 2B-th layer 32B be $In_{a'}(Ga,Al)_{b'} Zn_{c'} O_{d'}$, then a=a', b=b', c=c', and, further, d<d'. The results of examination of the correlation between the internal quantum efficiency and the difference in work function value are depicted in a graph in FIG. 8A, and the results of examination of the correlation between dark current (a current value obtained without irradiation with light at a reverse bias voltage of 1 volt, also in measurement in Example 3) and the difference in work function value are depicted in a graph in FIG. 8B. From FIGS. 8A and 8B, a clear increase in internal quantum efficiency and a clear lowering of dark current were observed as the difference between the work function value of the 2A-th layer of the second electrode and the work function value of the 2B-th layer of the second electrode increased to around 0.2 eV.

Figure 5:
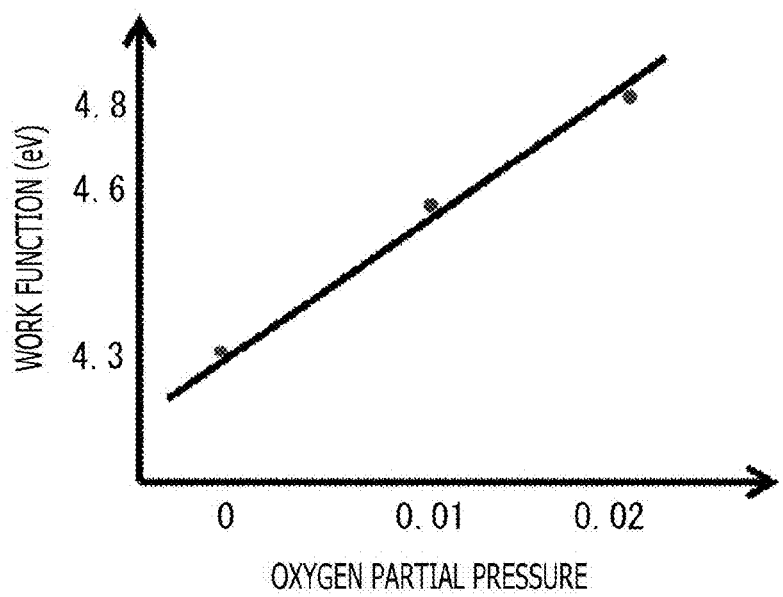
FIG. 5 is a graph depicting the results of determination of the relation between oxygen gas introduction amount (oxygen gas partial pressure) and work function of a first electrode at the time of forming the first electrode based on a sputtering method in Example 2.

In the production of the electronic device of Example 3, the work function values of the 2A-th layer 32A and the 2B-th layer 32B of the second electrode 32 are controlled by controlling the oxygen gas introduction amount at the time of formation based on a sputtering method, as for example depicted in the graph in FIG. 5, in the similar step to [Step 130] in Example 1.

In the electronic device of Example 3, since the second electrode includes the 2A-th layer and the 2B-th layer and the difference in work function between the 2A-th layer and the 2B-th layer is prescribed, optimization of the work function in the second electrode can be contrived, and transfer (migration) of carriers is further facilitated.

Example 4

Example 4 also is a modification of Example 1, and it relates to the electronic device of the (1-C)th configuration and the electronic device of the (1-D)th configuration. In the electronic device of Example 4, a first electrode 31 includes a transparent conductive material having a work function value of 5.2 to 5.9 eV, preferably 5.5 to 5.9 eV, more preferably 5.8 to 5.9 eV. Here, the transparent conductive material includes a material obtained by adding at least one metal species selected from the group consisting of cerium (Ce), gallium (Ga), tungsten (W) and titanium (Ti) to indium oxide in an amount of 0.5 to 10 at %, assuming that the total amount of indium atoms and the metal species atoms is 100 at %.

In Example 4, unlike in Example 1, a second electrode 32 was formed specifically from indium-tin oxide (ITO). The value of work function of the second electrode 32, which depends on film formation conditions, is 4.8 to 5.0 eV, for example. In other words, the value of work function of the second electrode 32 is not more than 5.0 eV. The first electrode 31 functions as an anode electrode (anode). In other words, it functions as an electrode for taking out holes. The second electrode 32 functions as a cathode electrode (cathode). In other words, it functions as an electrode for taking out electrons. A light emitting/light receiving layer 20 includes quinacridone having a thickness of 100 μm, for example.

In the electronic device of Example 4, the resistivity (electric resistivity) of the first electrode 31 is less than $1 \times 10^{-2}$ Ω·cm. In addition, the sheet resistance of the first electrode 31 is $3 \times 10$ to $1 \times 10^3$ Ω/□. Specifically, in an electronic device of Example 4A which will be described later, the sheet resistance of the first electrode 31 was 60Ω/□ when the film thickness of the first electrode was 100 nm. Further, the refractive index of the first electrode 31 is 1.9 to 2.2. Besides, the thickness of the first electrode 31 is $1 \times 10^{-8}$ to $2 \times 10^{-7}$ m, preferably $2 \times 10^{-8}$ to $1 \times 10^{-7}$ m. The first electrode 31 is formed based on a sputtering method. Besides, in this case, transmitted light spectrum width of the first electrode 31 is controlled by controlling the oxygen gas introduction amount (oxygen gas partial pressure) at the time of forming the first electrode 31 based on a sputtering method. Further, the oxygen content of the first electrode 31 is lower than the oxygen content according to the stoichiometric composition.

The light transmittance of the first electrode 31 to light of a wavelength of 400 to 660 nm is not less than 80%, and the light transmittance of the second electrode 32 to light of a wavelength 400 to 660 nm is also not less than 80%. The light transmittance of the first electrode 31 and the second electrode 32 can be measured by forming a film of each of the first electrode 31 and the second electrode 32 on a transparent glass plate.

A method of producing the electronic device of Example 4 will be described below, referring to FIGS. 1A and 1B.

[Step 400]

The first electrode 31 is formed in the similar manner to [step 100] in Example 1. It is to be noted, however, that unlike in Example 1, the first electrode 31 including the aforementioned transparent conductive material is formed (film formation) on an interlayer insulating film 13 on the basis of a co-sputtering method. A parallel plate sputtering apparatus or a DC magnetron sputtering apparatus was used as a sputtering apparatus, argon (Ar) gas was used as a process gas, and a sintered body of indium oxide and cerium, a sintered body of indium oxide and gallium, a sintered body of indium oxide and tungsten, and a sintered body of indium oxide and titanium were each used as a target.

[Step 410]

Next, patterning of the first electrode 31 is conducted, after which the first electrode 31 is subjected to a surface treatment of irradiating the surface of the first electrode 31 with UV rays. Immediately thereafter, the light emitting/light receiving layer 20 including quinacridone is formed (film formation) on the whole surface by a vacuum vapor deposition method, and, further, the second electrode 32 including ITO is formed (film formation) on the light emitting/light receiving layer 20 on the basis of a sputtering method. Here, at the time of forming the second electrode on the basis of the sputtering method, a parallel plate sputtering apparatus or a DC magnetron sputtering apparatus was used as a sputtering apparatus, argon (Ar) gas was used as a process gas, and an ITO sintered body was used as a target. Thereafter, an insulating layer 40 is formed (film formation) on the whole surface, in the similar manner to in [step 130] in Example 1. Specifically, based on the sputtering method, the second electrode 32 is covered with the insulating layer 40 including an insulating amorphous oxide (specifically, including an insulating material thin film). In this way, the electronic device of Example 4 having the structure depicted in FIG. 1B can be obtained.

An electronic device of Comparative Example 4 having the same configuration and structure as in Example 4 except that the first electrode of the electronic device of Example 4 included ITO.

The composition of the first electrode, the amount of metal species atoms added, crystallization temperature, optical characteristic (refractive index), resistivity, and values of work function before and after surface treatment, in Examples 4 and Comparative Example 4 are set forth in Table 3 below. By conducting a surface treatment based on irradiation with UV rays, the value of work function of the first electrode is raised, and a large difference in work function value between the first electrode and the second electrode can be obtained. Specifically, the value obtained by subtracting the work function value of the second electrode 32 from the work function value of the first electrode 31 is not less than 0.4 eV. Alternatively, by setting the value obtained by subtracting the work function value of the second electrode 32 from the work function value of the first electrode 31 to a value of not less than 0.4 eV, an internal electric field is generated in the light emitting/light receiving layer 20 on the basis of the difference in work function value, and enhancement of internal quantum efficiency is contrived. In Table 3, "difference A" is the value obtained by subtracting the work function value of the first electrode before treatment in Comparative Example 4 from the work function value of the first electrode before treatment in each Example 4, and "difference B" is the value obtained by subtracting the work function value of the first electrode after treatment in Comparative Example 4 from the work function value of the first electrode after treatment in each Example 4. Note that the second electrode in each Example 4 and Comparative Example 4 included ITO, and the value of work function of the second electrode was 4.8 eV.

TABLE 3

| | Unit | Example 4A | Example 4B | Example 4C | Example 4D | | Comparative Example 4 |
|---|---|---|---|---|---|---|---|
| Name | | ICO | IGO | IWO | ITiO | | ITO |
| Composition | | In—Ce—O | In—Ga—O | In—W—O | In—Ti—O | | In—Sn—O |
| Addition amount | at % | 10 | 10 | 1-7 | 0.5 | 5 | 10 |
| Crystallization temperature | °C. | ca. 300 | 230- | 200- | 150-200 | 150-200 | 150-200 |
| Refractive index | | 2.0 | 2.0 | 2.0 | 2.0 | 2.0 | 1.9-2.0 |
| Resistivity | | $2 \times 10^{-3}$ | $4 \times 10^{-4}$ | $4 \times 10^{-4}$ | $2 \times 10^{-4}$ | $2 \times 10^{-4}$ | $4 \times 10^{-4}$ |
| Work function | eV | | | | | | |
| Before treatment | | 5.7 | 5.7 | 5.2 | 5.5 | 5.2 | 4.8 |
| After treatment | | 5.8 | 5.9 | 5.8 | 5.8 | 5.9 | 5.0 |
| Difference A | | 0.9 | 0.9 | 0.4 | 0.7 | 0.4 | |
| Difference B | | 0.8 | 0.9 | 0.8 | 0.8 | 0.9 | |

Figure 9A:
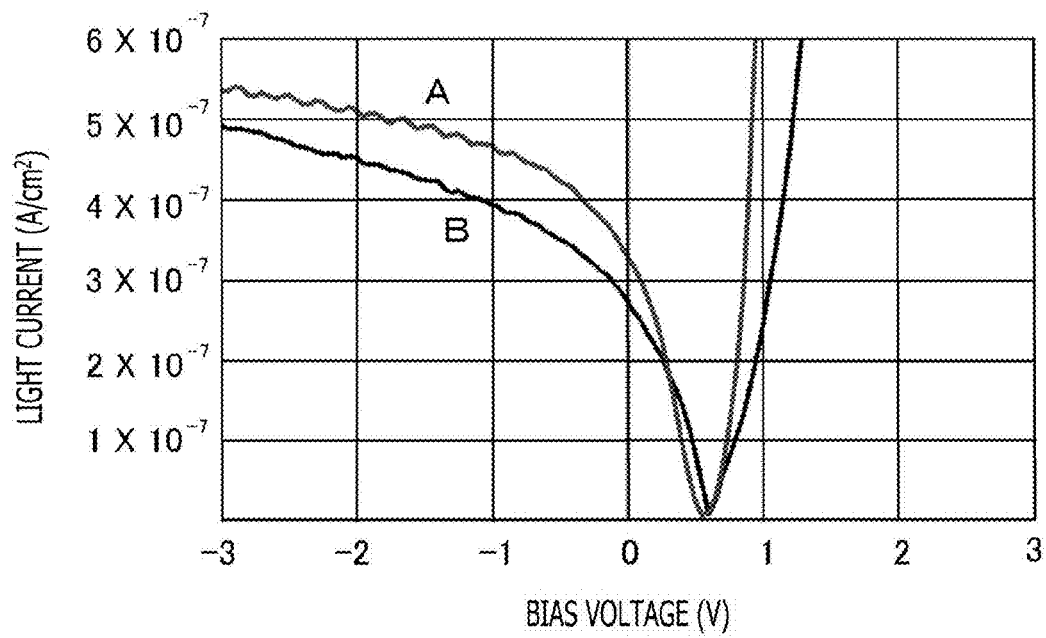
FIGS. 9A and 9B are graphs depicting I-V curves of light current and dark current obtained in an electronic device of Example 4A in which a first electrode includes indium-cerium oxide and an electronic device of Comparative Example 4 in which a first electrode includes ITO.
Figure 9B:
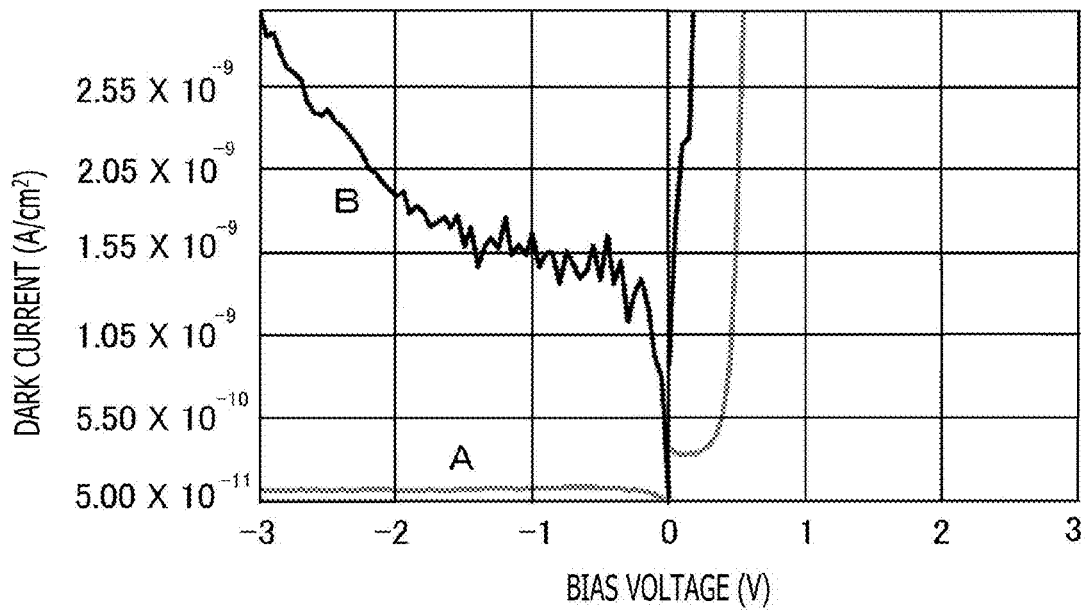
Figure 10:
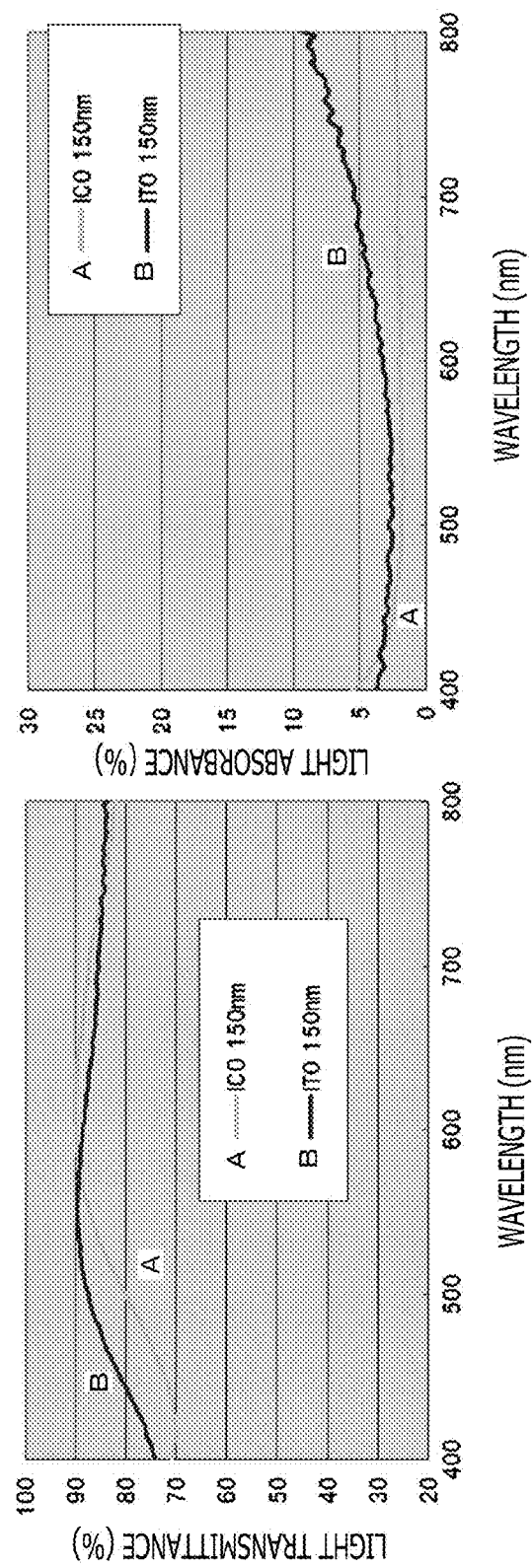
FIG. 10 depicts graphs depicting spectroscopic characteristics of first electrodes in electronic devices of Example 4A and Comparative Example 4.

I-V curves of light current obtained in an electronic device (photoelectric conversion element) of Example 4A in which the first electrode 31 included indium-cerium oxide (ICO) and an electronic device (photoelectric conversion element) of Comparative Example 4 in which the first electrode 31 included ITO are depicted in FIG. 9A. In FIGS. 9A, 9B and 10, "A" denotes the data on the electronic device of Example 4a, while "B" denotes the data on the electronic device of Comparative Example 4. It is seen from FIG. 9A that in the electronic device of Example 4A, the current value abruptly increases upon application of a reverse bias voltage of a little smaller than 1 volt (bias voltage: a little smaller than −1 volt). In addition, an I-V curve of dark current is depicted in FIG. 9B. It was confirmed that upon application of a bias voltage of −3 volt, the dark current was largely suppressed in Example 4A to $6 \times 10^{11}$ ampere/cm$^2$, as compared to that in Comparative Example 4 of $2 \times 10^{-9}$ ampere/cm$^2$.

In addition, values of internal quantum efficiency of the electronic devices of Example 4A and Comparative Example 4 are indicated in Table 4 below. Further, measurement results of surface roughness of the first electrode and the second electrode are set forth in Table 4. The surface roughness in Comparative Example 4 was about one order coarser than that in Example 4A. In Example 4, the surface roughness (arithmetic mean roughness) $Ra_1$ of the first electrode 31 is not more than 1 nm, and the root-mean-square roughness $Rq_1$ of the first electrode 31 is not more than 2 nm. In addition, the surface roughness (arithmetic mean roughness) $Ra_2$ of the second electrode 32 is not more than 1.5 nm, and the root-mean-square roughness $Rq_2$ of the second electrode 32 is not more than 2.5 nm. Further, measurement results of light transmittance of the second electrode are set forth in Table 4.

TABLE 4

| | Internal quantum efficiency (%) | Ra (nm) | Rq (nm) |
|---|---|---|---|
| Example 4A | 80 | 0.36 | 0.46 |
| Comparative Example 4 | 68 | 2.5 | 3.6 |

| | Example 4A | Comparative Example 4 |
|---|---|---|
| Internal quantum efficiency (%) | 80 | 68 |
| $Ra_1$ (nm) | 0.36 | 2.5 |

TABLE 4-continued

| | | |
|---|---|---|
| $Rq_1$ (nm) | 0.46 | 3.6 |
| $Ra_2$ (nm) | 0.6 | 2.4 |
| $Rq_2$ (nm) | 1.8 | 3.3 |
| Light transmittance at wavelength of 450 nm | 78% | 63% |
| Light transmittance at wavelength of 550 nm | 88% | 78% |

Spectroscopic characteristics of the first electrodes in the electronic devices of Example 4A and Comparative Example 4 are depicted in the top (light absorbance) and the bottom (light transmittance) of FIG. 10. Note that in Example 4A, the concentration of cerium added in the first electrode 31 was 10 at %, and the film thickness of the first electrode 31 was 150 nm. In addition, the film thickness of the first electrode in Comparative Example 4 was 150 nm. It was confirmed from FIG. 10 that spectroscopic characteristics in Example 4A and Comparative Example 4 are substantially the same.

Figure 11A:
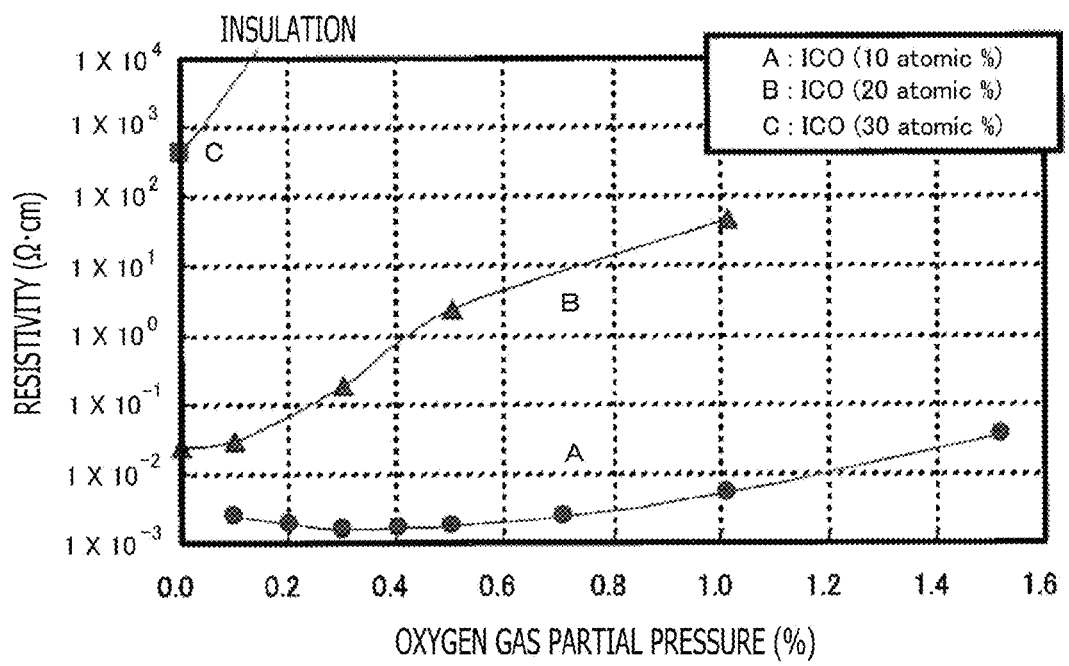
FIG. 11A is a graph depicting the results of measurement of the relation between oxygen gas introduction amount (oxygen gas partial pressure) and resistivity at the time of film formation of a first electrode, with the concentration of cerium added to the first electrode as a parameter in the electronic device of Example 4A.

Measurement results of the relation between oxygen gas introduction amount (oxygen gas partial pressure) at the time of film formation of the first electrode and resistivity, using as a parameter the concentration of cerium added in the first electrode of the electronic device of Example 4A, is depicted in FIG. 11A. At a cerium addition concentration of 10 at % (denoted by "A" in FIG. 11A), the resistivity was less than $1 \times 10^{-2}$ Ω·cm at an oxygen gas partial pressure on the order of 1%. On the other hand, at cerium addition concentrations of 20 at % (denoted by "B" in FIG. 11A) and 30 at % (denoted by "C" in FIG. 11A), the resistivity was in excess of $1 \times 10^{-2}$ Ω·cm.

Figure 11B:
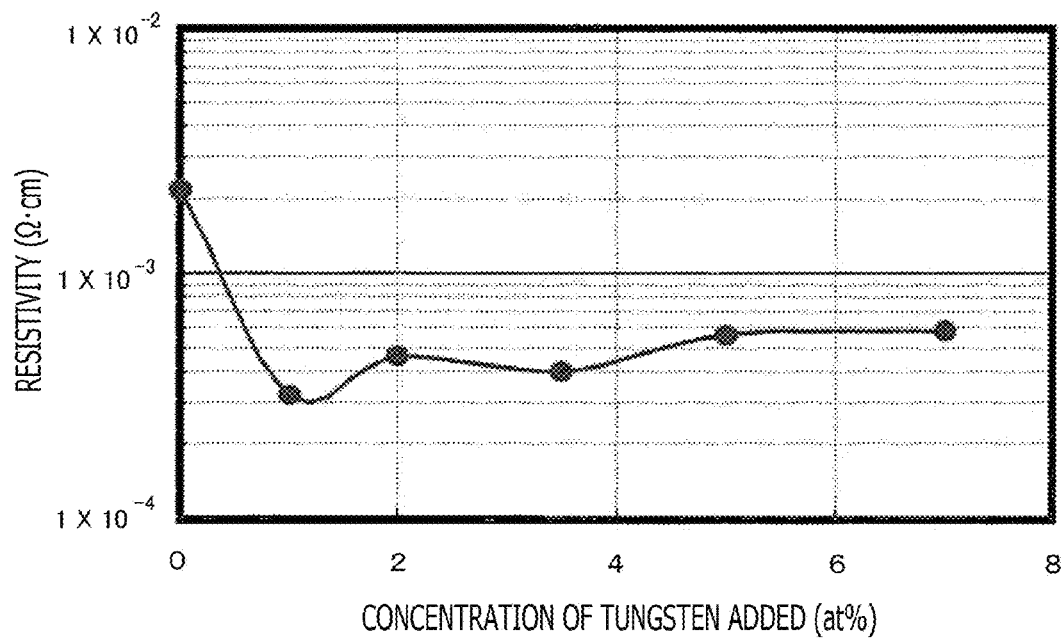
FIG. 11B is a graph depicting the results of measurement of the relation between the concentration of tungsten added and resistivity of a first electrode in an electronic device of Example 4C in which the first electrode includes indium-tungsten oxide.

Measurement results of the relation between the concentration of tungsten added in the first electrode of the electronic device of Example 4C, in which the first electrode 31 includes indium-tungsten oxide, and resistivity are depicted in FIG. 11B. At a tungsten addition concentration of 1 to 7 at %, the resistivity of the first electrode was not more than $1 \times 10^{-3}$ Ω·cm.

Figure 12A:
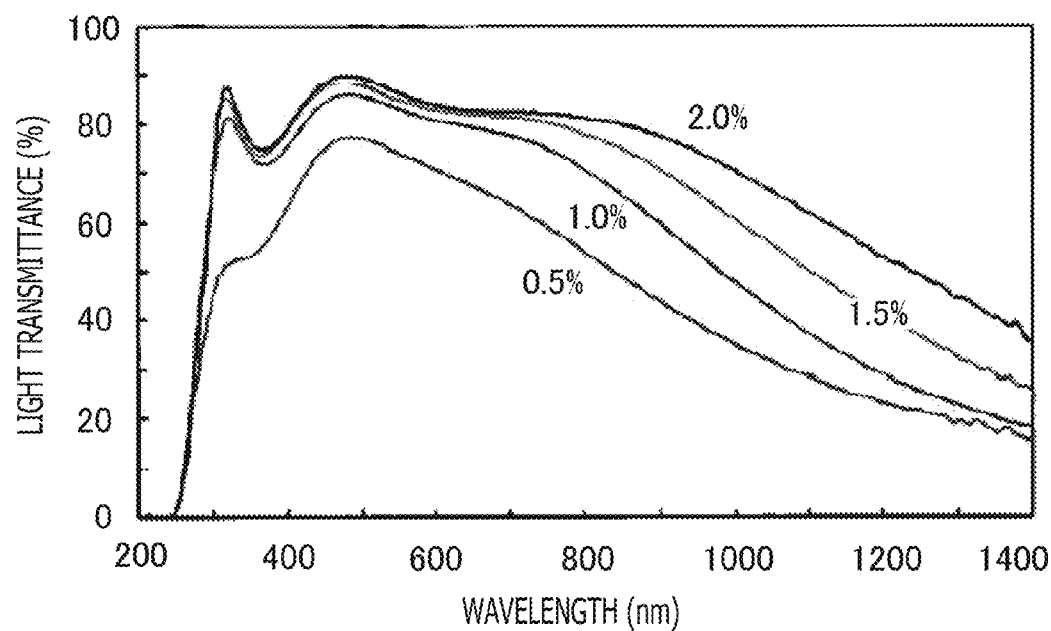
FIG. 12A is a graph depicting the results of measurement of the relation between oxygen gas introduction amount (oxygen gas partial pressure) and light transmittance at the time of film formation of a first electrode in the electronic device of Example 4C when the concentration of tungsten added in the first electrode is 2 at %.

Measurement results of the relation between the oxygen gas introduction amount (oxygen gas partial pressure) at the time of film formation of the first electrode and light transmittance when the concentration of tungsten added in the first electrode of the electronic device of Example 4C was 2 at % are depicted in FIG. 12A. Note that the oxygen gas partial pressure at the time of film formation was set at 0.5%, 1.0%, 1.5%, and 2.0%. As a result, it was found that when the oxygen gas partial pressure at the time of film formation was set to be not less than 1%, average transmittance in visible region in Comparative Example 4 was 82%, whereas that in Example 4C was 84%, indicating that Example 4C and Comparative Example 4 can realize comparable light transmittance characteristics.

Measurement results of the relation between the concentration of gallium added in the electronic device of Example 4B, in which the first electrode 31 includes indium-gallium oxide, and resistivity are indicated in Table 5 below. At gallium addition concentrations of up to 30 at %, a resistivity of $1 \times 10^{-3}$ Ω·cm could be retained. Note that the resistivity of ITO (Sn: 10 at %) was $4.1 \times 10^{-4}$ Ω·cm.

TABLE 5

| Concentration of gallium added (at %) | Resistivity (Ω · cm) |
|---|---|
| 10 | $4.5 \times 10^{-4}$ |
| 20 | $7.1 \times 10^{-4}$ |
| 30 | $1.2 \times 10^{-3}$ |
| 40 | $2.8 \times 10^{-3}$ |

Figure 12B:
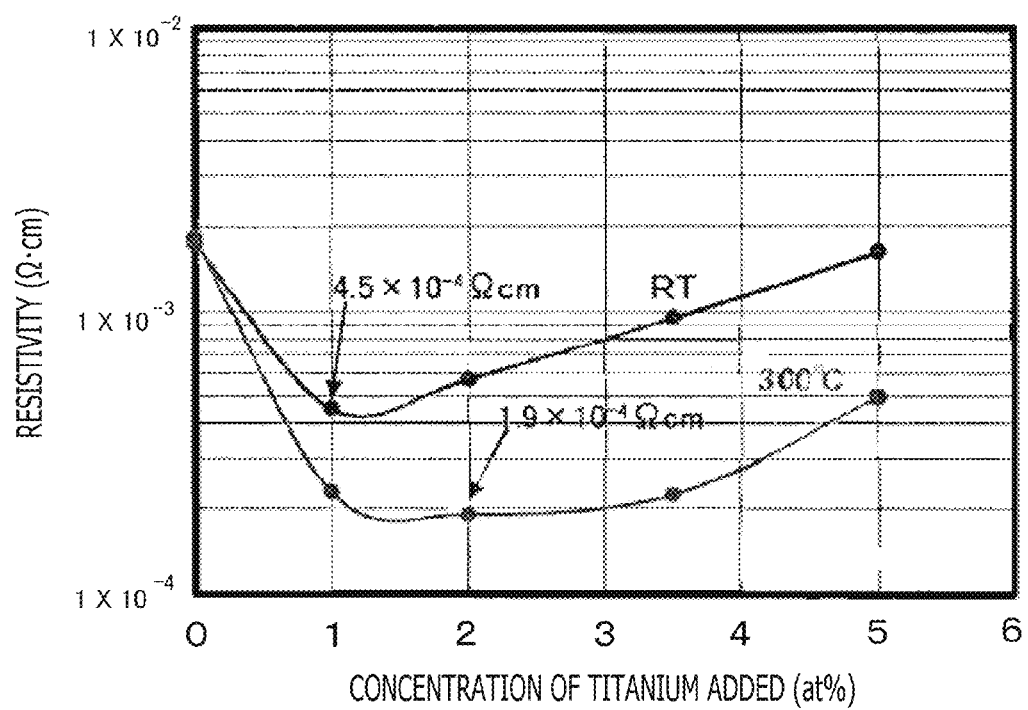
FIG. 12B is a graph depicting the results of measurement of the relation between the concentration of titanium added and resistivity of a first electrode in an electronic device of Example 4D in which the first electrode includes indium-titanium oxide.

Measurement results of the relation between the concentration of titanium added in the first electrode of the electronic device of Example 4D, in which the first electrode 31 includes indium-titanium oxide, and resistivity are depicted in FIG. 12B. In the case of film formation at room temperature (RT), a resistivity of $1 \times 10^{-3}$ Ω·cm could be retained at titanium addition concentrations of up to 4 at %. Besides, in the case of film formation at 300° C., a resistivity of $1 \times 10^{-3}$ Ω·cm could be retained even at titanium addition concentrations of up to 5 at %.

Summarizing the above results and, further, various test results, a configuration may be adopted in which the transparent conductive material includes <indium-cerium oxide (ICO)>, which is a material obtained by adding cerium to indium oxide, and the first electrode 31 has a thickness of $5 \times 10^{-8}$ to $2 \times 10^{-7}$ m and a resistivity of not less than $1 \times 10^{-3}$ Ω·cm and less than $1 \times 10^{-2}$ Ω·cm. Here, the concentration of cerium added is preferably 1 to 10 at %. Alternatively, a configuration may be adopted in which the transparent conductive material includes <indium-gallium oxide (IGO)>, which is a material obtained by adding gallium to indium oxide, and the first electrode 31 has a thickness of $5 \times 10^{-8}$ to $1.5 \times 10^{-7}$ m and a resistivity of $1 \times 10^{-5}$ to $1 \times 10^{-3}$ Ω·cm. Here, the concentration of gallium added is preferably 1 to 30 at %, desirably 1 to 10 at %. Alternatively, a configuration may be adopted in which the transparent conductive material includes <indium-tungsten oxide (IWO)>, which is a material obtained by adding tungsten to indium oxide, and the first electrode 31 has a thickness of $5 \times 10^{-8}$ to $2 \times 10^{-7}$ m and a resistivity of $1 \times 10^{-4}$ to $1 \times 10^{-3}$ Ω·cm. Here, the concentration of tungsten added is preferably 1 to 7 at %. Alternatively, a configuration may be adopted in which the transparent conductive material includes <indium-titanium oxide (ITiO)>, which is a material obtained by adding titanium to indium oxide, and the first electrode 31 has a thickness of $5 \times 10^{-8}$ to $2 \times 10^{-7}$ m and a resistivity of $1 \times 10^{-4}$ to $1 \times 10^{-3}$ Ω·cm. Here, the concentration of titanium added is preferably 0.5 to 5 at %.

Also in the case of the electronic devices in which the second electrode 32 included tin oxide ($SnO_2$), indium-doped gallium-zinc oxide (IGZO, In—$GaZnO_4$), aluminum oxide-doped zinc oxide (AZO), indium-zinc oxide (IZO), indium-gallium oxide (IGO), or gallium-doped zing oxide (GZO), it was possible to obtain substantially the similar results to those in the case of the electronic device of Example 4 in which the second electrode 32 included ITO.

As has been described above, in the electronic device of Example 4, the first electrode includes a transparent conductive material having a work function value of 5.2 to 5.9 eV. Therefore, it is possible to broaden the width of material choice as to the transparent conductive material for constituting the second electrode, in order to enlarge the difference between the work function value of the first electrode and the work function value of the second electrode, and it is possible to provide an electronic device having excellent characteristics. In addition, when a bias voltage (more specifically, a reverse bias voltage) is impressed between the first electrode and the second electrode, a large internal electric field can be generated in the light emitting/light receiving layer on the basis of the difference in work function value between the first electrode and the second electrode; as a result, enhancement of internal quantum efficiency can be contrived, an increase in photoelectric current can be contrived, and generation of dark current can be restrained.

Example 5

Example 5 relates to the imaging apparatus of the present disclosure. The imaging apparatus of Example 5 includes the electronic devices (specifically, the photoelectric conversion elements) of Examples 1 to 4.

Figure 13:
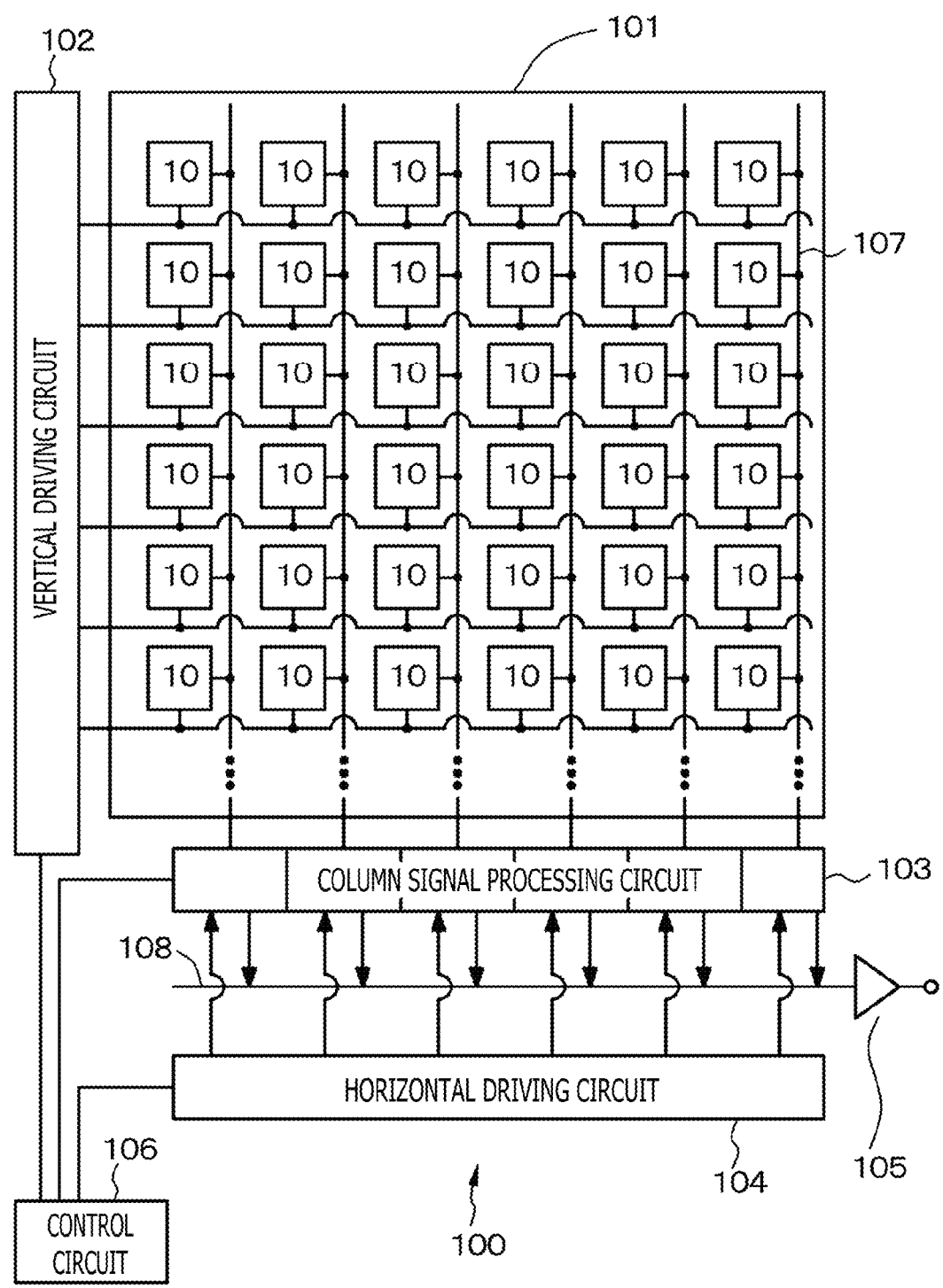
FIG. 13 is a conceptual diagram of an imaging apparatus of Example 5.

FIG. 13 depicts a conceptual diagram of the imaging apparatus (imaging element) of Example 5. The imaging apparatus 100 of Example 5 includes on a semiconductor substrate (e.g., silicon semiconductor substrate) an imaging region 101 in which the electronic devices (photoelectric conversion elements) 10 described in Examples 1 to 4 are arranged in a two-dimensional array, and, as peripheral circuits therefor, a vertical driving circuit 102, column signal processing circuits 103, a horizontal driving circuit 104, an output circuit 105, a control circuit 106 and the like. Note that it is natural that these circuits can be known circuits, or can be configured by using other circuit configurations (for example, various circuits used in conventional CCD imaging apparatus and CMOS imaging apparatuses).

The control circuit 106 produces clock signals and control signals to be references for operations of the vertical driving circuit 102, the column signal processing circuits 103 and the horizontal driving circuit 104 on the basis of a vertical synchronizing signal, a horizontal synchronizing signal and a master clock. The clock signals and control signals thus produced are inputted to the vertical driving circuit 102, the column signal processing circuits 103 and the horizontal driving circuit 104.

The vertical driving circuit 102, for example, includes shift registers, and performs selective scanning of the electronic devices 10 in the imaging region 101 sequentially in a vertical direction and on a row basis. Then, pixel signals based on currents (signals) produced according to the amounts of light received by the electronic devices 10 are sent to the column signal processing circuit 103 through vertical signal lines 107.

The column signal processing circuits 103 are disposed, for example, on the basis of column of the electronic devices 10, and applies signal processing such as noise removal and signal amplification to signals outputted from a one-row set of the electronic devices 10 on the basis of each electronic device 1 according to a signal from a black reference pixel (formed in the periphery of an effective pixel region, though not depicted). At an output stage of the column signal processing circuits 103, a horizontal selection switch (not depicted) is provided in connection between the column signal processing circuits 103 and a horizontal signal line 108.

The horizontal driving circuit 104, for example, includes a shift register, and, by sequentially outputting horizontal scanning pulses, sequentially selects each of the column signal processing circuits 103, and outputs signals from each of the column signal processing circuits 103 to the horizontal signal line 108.

The output circuit 105 applies signal processing to the signals sequentially supplied from each of the column signal processing circuits 103 through the horizontal signal line 108, and outputs the processed signals.

Though depending on the material constituting the light emitting/light receiving layer, a configuration may be adopted in which the light emitting/light receiving layer itself functions also as a color filter, and, therefore, color separation can be accomplished without arranging color filters. Note that in some cases, known color filters permitting transmission therethrough of a specified wavelength such as, for example, red color, green color, blue color, cyan color, magenta color, or yellow color may be disposed on the upper side on the light incidence side of the electronic devices 10. In addition, the imaging apparatus may be of a front side illumination type or may be a back side illumination type. Besides, a shutter for controlling the incidence of light on the electronic devices 10 may be disposed, as required.

While the present disclosure has been described based on the preferable Examples above, the present disclosure is not to be restricted by these Examples. The structures or configurations, production conditions, production methods, materials used, of the electronic devices (photoelectric conversion elements, imaging elements) and the imaging apparatuses described in Examples are mere examples, and can be modified, as required. In the case of letting the electronic device of the present disclosure function as a solar cell, the light emitting/light receiving layer may be illuminated with light in a state where no voltage is impressed between the first electrode and the second electrode. In addition, it is possible to configure not only an imaging apparatus such as television camera but also a photosensor and an image sensor by use of the electronic device of the present disclosure.

Tin oxide can also be substitutively used as a main component of the metal oxide for constituting the insulating material or the insulating layer, and by this approach, also, it was possible to obtain the similar effects to those in the case of using zinc oxide. Further, also in the case of using a metal oxide containing, as accessory components, at least two materials selected from the group consisting of aluminum oxide, magnesium oxide, niobium oxide, titanium oxide, molybdenum oxide and hafnium oxide, other than the combination of aluminum oxide and magnesium oxide, it was possible to obtain the similar effects to those in the case of using a metal oxide containing, as accessory components, aluminum oxide and magnesium oxide.

Note that the present disclosure may also take the following configurations.

[A01] «Electronic Device»

An electronic device including a first electrode, a light emitting/light receiving layer formed on the first electrode, and a second electrode formed on the light emitting/light receiving layer, in which the light emitting/light receiving layer and/or the second electrode is covered by an insulating layer including a metal oxide that contains, as a main component, zinc oxide, while containing, as accessory components, at least two materials selected from the group consisting of aluminum oxide, magnesium oxide, niobium oxide, titanium oxide, molybdenum oxide and hafnium oxide.

[A02]

The electronic device as described in [A01], in which the content of the accessory components is 5 to 30 at %, on a metallic atom basis.

[A03]

The electronic device as described in [A01] or [A02], in which the accessory components include aluminum oxide and magnesium oxide. [A04]

The electronic device as described in any one of [A01] to [A03], in which the thickness of the insulating layer on the second electrode is $5 \times 10^{-8}$ to $7 \times 10^{-7}$ m. [A05]

The electronic device as described in any one of [A01] to [A04], in which the absolute value of internal stress in the insulating layer is not more than 50 MPa.

[A06]

The electronic device as described in any one of [A01] to [A05], in which the insulating layer is transparent and amorphous.

[A07]

The electronic device as described in any one of [A01] to [A06], in which the light transmittance of the insulating layer to light of a wavelength of 400 to 660 nm is not less than 80%.

[A08]

The electronic device as described in any one of [A01] to [A07], in which the light transmittance of the second electrode to light of a wavelength of 400 to 660 nm is not less than 75%.

[A09]

The electronic device as described in any one of [A01] to [A08], in which the light emitting/light receiving layer includes an organic photoelectric conversion material.

[A10]

The electronic device as described in [A09], which includes a photoelectric conversion element.

[A11]

The electronic device as described in any one of [A01] to [A10], in which the sheet resistance of the insulating layer is not less than $1 \times 10^5 \Omega/\square$.

[A12]

The electronic device as described in any one of [A01] to [A11], in which the refractive index of the insulating layer is 1.9 to 2.2.

[A13]

The electronic device as described in any one of [A01] to [A12], in which the surface roughness Ra of the first electrode is not more than 1 nm.

[A14]

The electronic device as described in [A13], in which the root-mean-square roughness Rq of the first electrode is not more than 2 nm.

[A15]

The imaging element as described in any one of [A01] to [A14], in which the surface roughness Ra of the second electrode is not more than 1.5 nm.

[A16]

The imaging element as described in any one of [A01] to [A14], in which the root-mean-square roughness Rq of the second electrode is not more than 2.5 nm.

[B01] «The (1-A)th Configuration»

The electronic device as described in any one of [A01] to [A16], in which the difference between the value of work function of the second electrode and the value of work function of the first electrode is not less than 0.4 eV.

[B02]

The electronic device as described in [B01], in which the difference between the value of work function of the second electrode and the value of work function of the first electrode is set to be not less than 0.4 eV, whereby an internal electric field is generated in the light emitting/light receiving layer on the basis of the difference in work function value, and enhancement of internal quantum efficiency is contrived.

[B03]

The electronic device as described in [B01] or [B02], in which the second electrode includes indium-gallium oxide, indium-doped gallium-zinc oxide, aluminum oxide-doped zin oxide, indium-zinc oxide, or gallium-doped zinc oxide.

[B04]

The electronic device as described in any one of [B01] to [B03], in which the sheet resistance of the second electrode is $3\times10$ to $1\times10^3 \Omega/\square$.

[B05]

The electronic device as described in any one of [B01] to [B04], in which the value of work function of the second electrode is 4.1 to 4.5 eV.

[B06]

The electronic device as described in any one of [B01] to [B05], in which the first electrode includes indium-tin oxide, indium-zinc oxide, or tin oxide.

[C01] «The (1-B)th Configuration»

The electronic device as described in any one of [A01] to [A16], in which the second electrode has a stacked structure of a 2B-th layer and a 2B-th layer from the light emitting/light receiving layer side, and the value of work function of the 2A-th layer of the second electrode is lower than the value of work function of the 2B-th layer of the second electrode.

[C02]

The electronic device as described in [C01], in which the difference between the value of work function of the 2A-th layer of second electrode and the value of work function of the 2B-th layer of the second electrode is 0.1 to 0.2 eV.

[C03]

The electronic device as described in [C01] or [C02], in which the difference between the value of work function of the first electrode and the value of work function of the 2A-th layer of the second electrode is not less than 0.4 eV.

[C04]

The electronic device as described in any one of [C01] to [C03], in which the difference between the value of work function of the first electrode and the value of work function of the 2A-th layer of the second electrode is set to be not less than 0.4 eV, whereby an internal electric field is generated in the light emitting/light receiving layer on the basis of the difference in work function value, and enhancement of internal quantum efficiency is contrived.

The electronic device as described in any one of [C01] to [C04], in which the thickness of the second electrode is $1\times10^{-8}$ to $1\times10^{-7}$ m, and the ratio of the thickness of the 2A-th layer of the second electrode and the thickness of the 2B-th layer of the second electrode is from 9/1 to 1/9.

[C06]

The electronic device as described in any one of [B01] to [C05], in which the value of work function of the second electrode is controlled by controlling oxygen gas introduction amount at the time of forming the second electrode on the basis of a sputtering method.

[C07]

The electronic device as described in any one of [B01] to [C06], in which the content of oxygen is lower than an oxygen content according to a stoichiometric composition.

[D01] «The (1-C)th Configuration»

The electronic device as described in any one of [A01] to [A16], in which the first electrode includes a transparent conductive material that has a value of work function of 5.2 to 5.9 eV.

[D02]

The electronic device as described in [D01], in which the transparent conductive material includes a material obtained by adding at least one metal species selected from the group consisting of cerium, gallium, tungsten and titanium to indium oxide in an amount of 0.5 to 10 at %, assuming that the total amount of indium atoms and the metal species atoms is 100 at %.

[D03]

The electronic device as described in [D01] or [D02], in which the resistivity of the first electrode is less than $1\times10^{-2}$ $\Omega\cdot$cm.

[D04]

The electronic device as described in any one of [D01] to [D03], in which the sheet resistance of the first electrode is $3\times10$ to $1\times10^3 \Omega/\square$.

[D05]

The electronic device as described in any one of [D01] to [D04], in which the thickness of the first electrode is $1\times10^{-8}$ to $2\times10^{-7}$ m.

[D06]

The electronic device as described in [D05], in which the thickness of the first electrode is $2\times10^{-8}$ to $1\times10^{-7}$ m.

[D07]

The electronic device as described in [D01], in which the transparent conductive material includes a material obtained by adding cerium to indium oxide, and the first electrode has a thickness of $5\times10^{-8}$ to $2\times10^{-7}$ m and a resistivity of not less than $1\times10^{-3}$ $\Omega\cdot$cm and less than $1\times10^{-2}$ $\Omega\cdot$cm.

[D08]

The electronic device as described in [D07], in which the proportion of cerium atoms is 1 to 10 at %, assuming that the total amount of indium atoms and cerium atoms is 100 at %.

[D09]

The electronic device as described in [D01], in which the transparent conductive material includes a material obtained by adding gallium to indium oxide, and the first electrode has a thickness of $5\times10^{-8}$ to $1.5\times10^{-7}$ m and a resistivity of $1\times10^{-5}$ to $1\times10^{-3}$ $\Omega\cdot$cm.

[D10]

The electronic device as described in [D09], in which the proportion of gallium atoms is 1 to 30 at %, assuming that the total amount of indium atoms and gallium atoms is 100 at %.

[D11]

The electronic device as described in [D01], in which the transparent conductive material includes a material obtained by adding tungsten to indium oxide, and the first electrode has a thickness of $5\times10^{-8}$ to $2\times10^{-7}$ m and a resistivity of $1\times10^{-4}$ to $1\times10^{-3}$ Ω·cm.

[D12]

The electronic device as described in [D11], in which the proportion of tungsten atoms is 1 to 7 at %, assuming that the total amount of indium atoms and tungsten atoms is 100 at %.

[D13]

The electronic device as described in [D01],
in which the transparent conductive material includes a material obtained by adding titanium to indium oxide, and
the first electrode has a thickness of $5\times10^{-8}$ to $2\times10^{-7}$ m and a resistivity of $1\times10^{-4}$ to $1\times10^{-3}$ Ω·cm.

[D14]

The electronic device as described in [D13], in which the proportion of titanium atoms is 0.5 to 5 at %, assuming that the total amount of indium atoms and titanium atoms is 100 at %.

[D15]

The electronic device as described in any one of [D01] to [D14], in which the value of work function of the second electrode is not more than 5.0 eV.

[D16]

The electronic device as described in any one of [D01] to [D15], in which the second electrode includes indium-tin oxide, indium-zinc oxide, or tin oxide.

[D17]

The electronic device as described in any one of [D01] to [D15], in which the second electrode includes indium-gallium oxide, indium-doped gallium-zinc oxide, aluminum oxide-doped zinc oxide, indium-zinc oxide, or gallium-doped zinc oxide.

[D18]

The electronic device as described in any one of [D01] to [D17], in which transmitted light spectrum width of the first electrode is controlled by controlling oxygen gas introduction amount at the time of forming the first electrode on the basis of a sputtering method.

[E01] «Imaging Apparatus»

An imaging apparatus including the electronic device as described in any one of [A01] to [D18].

[F01] «Insulating Layer»

An insulating material including a metal oxide that contains, as a main component, zinc oxide, while containing, as accessory components, at least two materials selected from the group consisting of aluminum oxide, magnesium oxide, niobium oxide, titanium oxide, molybdenum oxide, and hafnium oxide.

[F02]

The insulating material as described in [F01], in which the content of the accessory components is 5 to 30 at %, on a metallic atom basis.

[F03]

The insulating material as described in [F01] or [F02], in which the accessory components include aluminum oxide and magnesium oxide.

REFERENCE SIGNS LIST

10 . . . Electronic device, 11 . . . Substrate, 12 . . . Wiring, 13 . . . Interlayer insulating film, 14 . . . Opening, 20 . . . Light emitting/light receiving layer, 31 . . . First electrode, 32 . . . Second electrode, 32A . . . 2A-th layer of second electrode, 32b . . . 2B-th layer of second electrode, 40 . . . Insulating layer, 100 . . . Imaging apparatus, 101 . . . Imaging region, 102 . . . Vertical driving circuit, 103 . . . Column signal processing circuit, 104 . . . Horizontal driving circuit, 105 . . . Output circuit, 106 . . . Control circuit, 107 . . . Vertical signal line, 108 . . . Horizontal signal line

The invention claimed is:

1. An electronic device comprising:
   a substrate;
   a first electrode formed on the substrate;
   a light receiving layer formed on the first electrode;
   a second electrode formed on the light receiving layer; and
   an amorphous insulating layer covering both of the light receiving layer and the second electrode, wherein the amorphous insulating layer includes a metal oxide, wherein the metal oxide contains zinc oxide and at least two materials selected from a group consisting of aluminum oxide, magnesium oxide, niobium oxide, titanium oxide, molybdenum oxide and hafnium oxide, wherein the metal oxide contains a greater amount of zinc oxide than the at least two materials, wherein light transmittance of the amorphous insulating layer to light of a wavelength of between 400 and 660 nm is at least 80%.

2. The electronic device according to claim 1, wherein the metal oxide is at or between 5 and 30%, on a metallic atom basis.

3. The electronic device according to claim 1, wherein the at least two materials include aluminum oxide and magnesium oxide.

4. The electronic device according to claim 1, wherein the thickness of the amorphous insulating layer on the second electrode is $5\times10^{-8}$ to $7\times10^{-7}$ m.

5. The electronic device according to claim 1, wherein the absolute value of an internal stress in the amorphous insulating layer is not more than 50 MPa.

6. The electronic device according to claim 1, wherein the amorphous insulating layer is transparent.

7. The electronic device according to claim 1, wherein a light transmittance of the second electrode to light of a wavelength of 400 to 660 nm is not less than 75%.

8. The electronic device according to claim 1, wherein the light receiving layer includes an organic photoelectric conversion material.

9. The electronic device according to claim 8, including a photoelectric conversion element.

10. An imaging apparatus comprising an electronic device, the electronic device comprising:
    a substrate;
    a first electrode formed on the substrate;
    a light receiving layer formed on the first electrode;
    a second electrode formed on the light receiving layer; and
    an amorphous insulating layer covering both of the light receiving layer and the second electrode, wherein the amorphous insulating layer includes a metal oxide, wherein the metal oxide contains zinc oxide and at least two materials selected from a group consisting of aluminum oxide, magnesium oxide, niobium oxide, titanium oxide, molybdenum oxide and hafnium oxide, wherein the metal oxide contains a greater amount of zinc oxide than the at least two materials, wherein light transmittance of the amorphous insulating layer to light of a wavelength of between 400 and 660 nm is at least 80%.

11. An amorphous insulating material including a metal oxide that contains zinc oxide and at least two materials selected from a group consisting of aluminum oxide, magnesium oxide, niobium oxide, titanium oxide, molybdenum oxide and hafnium oxide, wherein the metal oxide contains a greater amount of zinc oxide than the at least two materials, wherein light transmittance of the amorphous insulating material to light of a wavelength of between 400 and 660 nm is at least 80%.

* * * * *